US012796003B2

(12) United States Patent
Tamaru et al.

(10) Patent No.: US 12,796,003 B2
(45) Date of Patent: Nov. 10, 2026

(54) SEMICONDUCTOR DEVICE

(71) Applicant: Japan Display Inc., Tokyo (JP)

(72) Inventors: Takaya Tamaru, Tokyo (JP); Masashi Tsubuku, Tokyo (JP); Hajime Watakabe, Tokyo (JP); Toshinari Sasaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 362 days.

(21) Appl. No.: 18/465,251

(22) Filed: Sep. 12, 2023

(65) Prior Publication Data

US 2024/0088302 A1 Mar. 14, 2024

(30) Foreign Application Priority Data

Sep. 13, 2022 (JP) ................................ 2022-145635

(51) Int. Cl.
*H10D 30/67* (2025.01)

(52) U.S. Cl.
CPC ............................... *H10D 30/6755* (2025.01)

(58) Field of Classification Search
CPC ........... H10D 30/6755; H10D 30/6723; H10D 30/6734; H10D 30/6756; H10D 30/6758; H10D 30/6739; H10D 62/10; H10D 62/80; H10D 86/40; H10D 86/423; H10D 86/471; H10D 86/60; H10D 62/124; H10D 30/6757; H10D 99/00; H10D 30/6704
USPC ......................................................... 257/288
See application file for complete search history.

(56) References Cited

U.S. PATENT DOCUMENTS

| | | | | |
|---|---|---|---|---|
| 9,947,799 B2 | 4/2018 | Yamazaki | | |
| 2011/0309456 A1* | 12/2011 | Yamazaki .......... | H10D 30/6739 257/411 |
| 2012/0064664 A1 | 3/2012 | Yamazaki et al. | |
| 2012/0252160 A1 | 10/2012 | Yamazaki | |
| 2013/0056833 A1* | 3/2013 | Takeoka ............ | H10D 84/0177 257/411 |
| 2013/0285044 A1 | 10/2013 | Yuan et al. | |
| 2014/0034946 A1 | 2/2014 | Yamazaki et al. | |
| 2014/0077205 A1 | 3/2014 | Yamazaki et al. | |
| 2014/0113405 A1 | 4/2014 | Tsubuku et al. | |
| 2014/0151695 A1 | 6/2014 | Yamazaki | |

(Continued)

FOREIGN PATENT DOCUMENTS

| | | |
|---|---|---|
| CN | 102683424 A | 9/2012 |
| JP | 2014099601 A | 5/2014 |

(Continued)

OTHER PUBLICATIONS

English machine translation of Office Action dated Sep. 27, 2024, issued in TW Application No. 112132291, 3 pages.

(Continued)

*Primary Examiner* — Monica D Harrison
(74) *Attorney, Agent, or Firm* — Maier & Maier, PLLC

(57) ABSTRACT

A semiconductor device according to an embodiment includes: a substrate; a metal oxide layer arranged above the substrate and having aluminum as the main component of the metal oxide layer; an oxide semiconductor layer arranged above the metal oxide layer; a gate electrode facing the oxide semiconductor layer; and a gate insulating layer between the oxide semiconductor layer and the gate electrode, wherein a thickness of the metal oxide layer is 1 nm or more and 4 nm or less.

8 Claims, 21 Drawing Sheets

(56) References Cited

U.S. PATENT DOCUMENTS

| | | | |
|---|---|---|---|
| 2015/0069392 A1 | 3/2015 | Yamazaki | |
| 2015/0084043 A1 | 3/2015 | Ishihara et al. | |
| 2017/0236844 A1 | 8/2017 | Yamazaki et al. | |
| 2018/0197997 A1* | 7/2018 | Ito | H10D 30/6756 |

FOREIGN PATENT DOCUMENTS

| | | | |
|---|---|---|---|
| JP | 2016184771 | A | 10/2016 |
| JP | 2018006730 | A | 1/2018 |
| JP | 2021108405 | A | 7/2021 |
| JP | 2021141338 | A | 9/2021 |
| JP | 2021153196 | A | 9/2021 |
| KR | 1020130114078 | A | 10/2013 |
| TW | 201212234 | A | 3/2012 |

OTHER PUBLICATIONS

English machine translation of Office Action dated May 12, 2025, issued in TW Appl. No. 112132291, 6 pages.
English machine translation of Office Action dated Jun. 12, 2024, issued in TW Application No. 112132291, 4 pages.
English machine translation of Office Action issued on Jul. 25, 2024, in corresponding Korean Application No. 1020230113638, 5 pages.
Extended European Search Report issued on Feb. 9, 2024, in corresponding European Application No. 23196138.4, 8 pages.

* cited by examiner

SEMICONDUCTOR DEVICE

CROSS REFERENCE TO RELATED APPLICATIONS

This application claims the benefit of priority to Japanese Patent Application No. 2022-145635 filed on Sep. 13, 2022, the entire contents of which are incorporated herein by reference.

FIELD

An embodiment of the present invention relates to a semiconductor device. In particular, an embodiment of the present invention relates to a semiconductor device in which an oxide semiconductor is used as a channel.

BACKGROUND

In recent years, a semiconductor device in which an oxide semiconductor is used for a channel instead of amorphous silicon, low-temperature polysilicon, and single-crystal silicon has been developed (for example, Japanese laid-open patent publication No. 2021-141338, Japanese laid-open patent publication No. 2014-099601, Japanese laid-open patent publication No. 2021-153196, Japanese laid-open patent publication No. 2018-006730, Japanese laid-open patent publication No. 2016-184771, and Japanese laid-open patent publication No. 2021-108405). The semiconductor device in which the oxide semiconductor is used for the channel can be formed with a simple structure and a low-temperature process, similar to a semiconductor device in which amorphous silicon is used as a channel. The semiconductor device in which the oxide semiconductor is used for the channel is known to have higher mobility than the semiconductor device in which amorphous silicon is used for the channel.

It is essential to supply oxygen to an oxide semiconductor layer in the manufacturing process and to reduce the oxygen vacancies formed in the oxide semiconductor layer in order for the semiconductor device in which the oxide semiconductor is used for the channel to perform a stable operation. For example, a technique of forming an insulating layer covering the oxide semiconductor layer under the condition that the insulating layer contains more oxygen is disclosed as one method of supplying oxygen to the oxide semiconductor layer.

However, the insulating layer formed with more oxygen-containing conditions contains more defects. As a result, abnormal characteristics of the semiconductor device or a variation in characteristics in a reliability test occur, which are considered to be caused by electron-trapping in the defect. On the other hand, if an insulating layer with fewer defects is used, oxygen in the insulating layer cannot be increased. Therefore, sufficient oxygen cannot be supplied from the insulating layer to the oxide semiconductor layer. As described above, there is a demand for realizing a structure capable of repairing oxygen vacancies formed in the oxide semiconductor layer while reducing defects in the insulating layer that cause the variation in characteristics of the semiconductor device.

SUMMARY

A semiconductor device according to an embodiment includes: a substrate; a metal oxide layer arranged above the substrate and having aluminum as the main component of the metal oxide layer; an oxide semiconductor layer arranged above the metal oxide layer; a gate electrode facing the oxide semiconductor layer; and a gate insulating layer between the oxide semiconductor layer and the gate electrode, wherein a thickness of the metal oxide layer is 1 nm or more and 4 nm or less.

DESCRIPTION OF EMBODIMENTS

Figure 1:
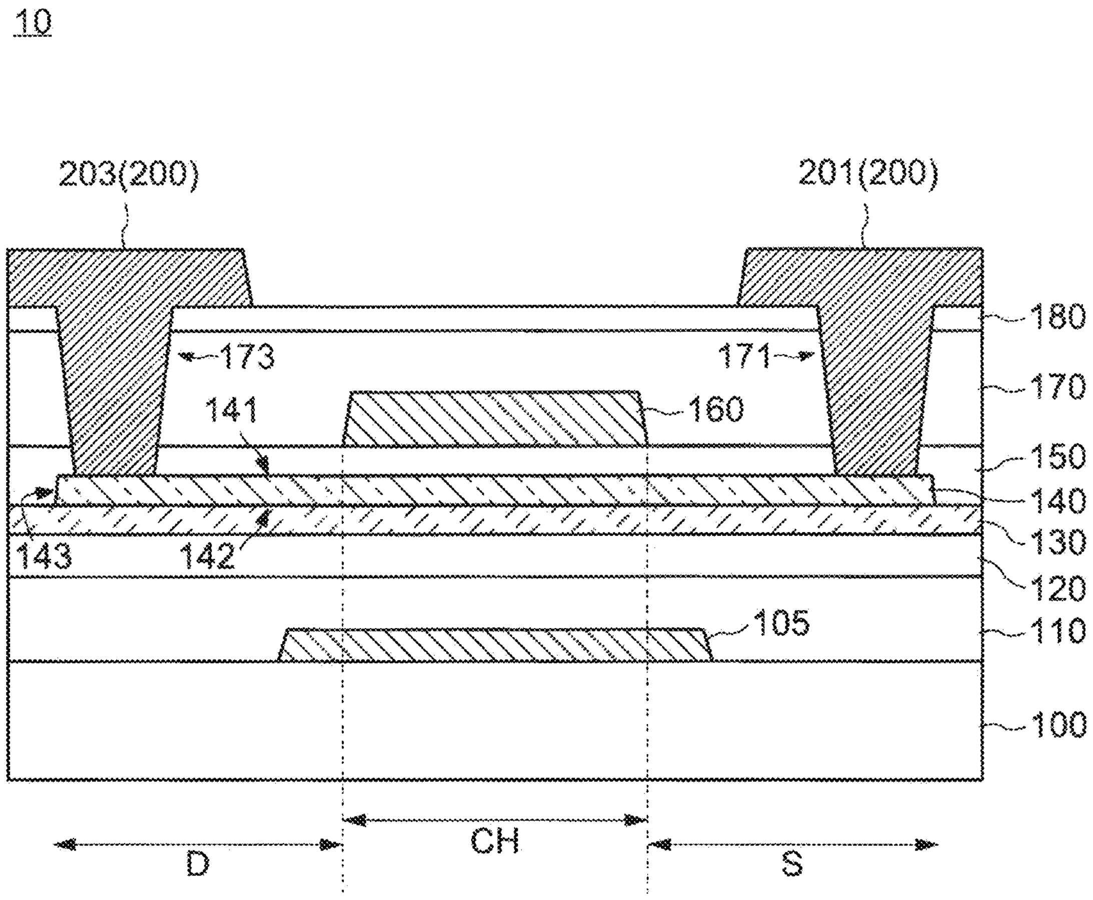
FIG. 1 is a cross-sectional view showing an outline of a semiconductor device according to an embodiment of the present invention.

Embodiments of the present invention will be described below with reference to the drawings. The following disclosure is merely an example. A configuration that can be easily conceived by a person skilled in the art by appropriately changing the configuration of the embodiment while maintaining the gist of the invention is naturally included in the scope of the present invention. For the sake of clarity of description, the drawings may be schematically represented with respect to widths, thicknesses, shapes, and the like of the respective portions in comparison with actual embodiments. However, the shape shown is merely an example and does not limit the interpretation of the present invention. In this specification and each of the drawings, the same symbols are assigned to the same components as those described previously with reference to the preceding drawings, and a detailed description thereof may be omitted as appropriate.

In the embodiments of the present invention, a direction from a substrate to an oxide semiconductor layer is referred to as "on" or "above". Reversely, a direction from the oxide semiconductor layer to the substrate is referred to as "under" or "below". As described above, for convenience of explanation, although the phrase "above (on)" or "below (under)" is used for explanation, for example, a vertical relationship between the substrate and the oxide semiconductor layer may be arranged in a different direction from that shown in the drawing. In the following description, for example, the expression "the oxide semiconductor layer on the substrate" merely describes the vertical relationship between the substrate and the oxide semiconductor layer as described above, and other members may be arranged between the substrate and the oxide semiconductor layer. Above or below means a stacking order in a structure in which multiple layers are stacked, and when it is expressed as a pixel electrode above a transistor, it may be a positional relationship where the transistor and the pixel electrode do not overlap each other in a plan view. On the other hand, when it is expressed as a pixel electrode vertically above a transistor, it means a positional relationship where the transistor and the pixel electrode overlap each other in a plan view.

"Display device" refers to a structure configured to display an image using electro-optic layers. For example, the term display device may refer to a display panel including the electro-optic layer, or it may refer to a structure in which other optical members (e.g., polarizing member, backlight, touch panel, etc.) are attached to a display cell. The "electro-optic layer" can include a liquid crystal layer, an electroluminescence (EL) layer, an electrochromic (EC) layer, and an electrophoretic layer, as long as there is no technical contradiction. Therefore, although the embodiments described later will be described by exemplifying the liquid crystal display device including a liquid crystal layer and an organic EL display device including an organic EL layer as the display device, the structure in the present embodiment can be applied to a display device including the other electro-optic layers described above.

The expressions "a includes A, B, or C", "a includes any of A, B, and C", and "α includes one selected from a group consisting of A, B, and C" do not exclude the case where α includes multiple combinations of A to C unless otherwise specified. Furthermore, these expressions do not exclude the case where a includes other elements.

In addition, the following embodiments may be combined with each other as long as there is no technical contradiction.

An object of the embodiment of the present invention is to realize a highly reliable semiconductor device having high mobility.

1. First Embodiment

A semiconductor device according to an embodiment of the present invention will be described with reference to FIG. 1 to FIG. 12. For example, a semiconductor device of the embodiment described below may be used in an integrated circuit (IC) such as a micro-processing unit (MPU) or a memory circuit in addition to a transistor used in a display device.

[1-1. Configuration of Semiconductor Device 10]

Figure 2:
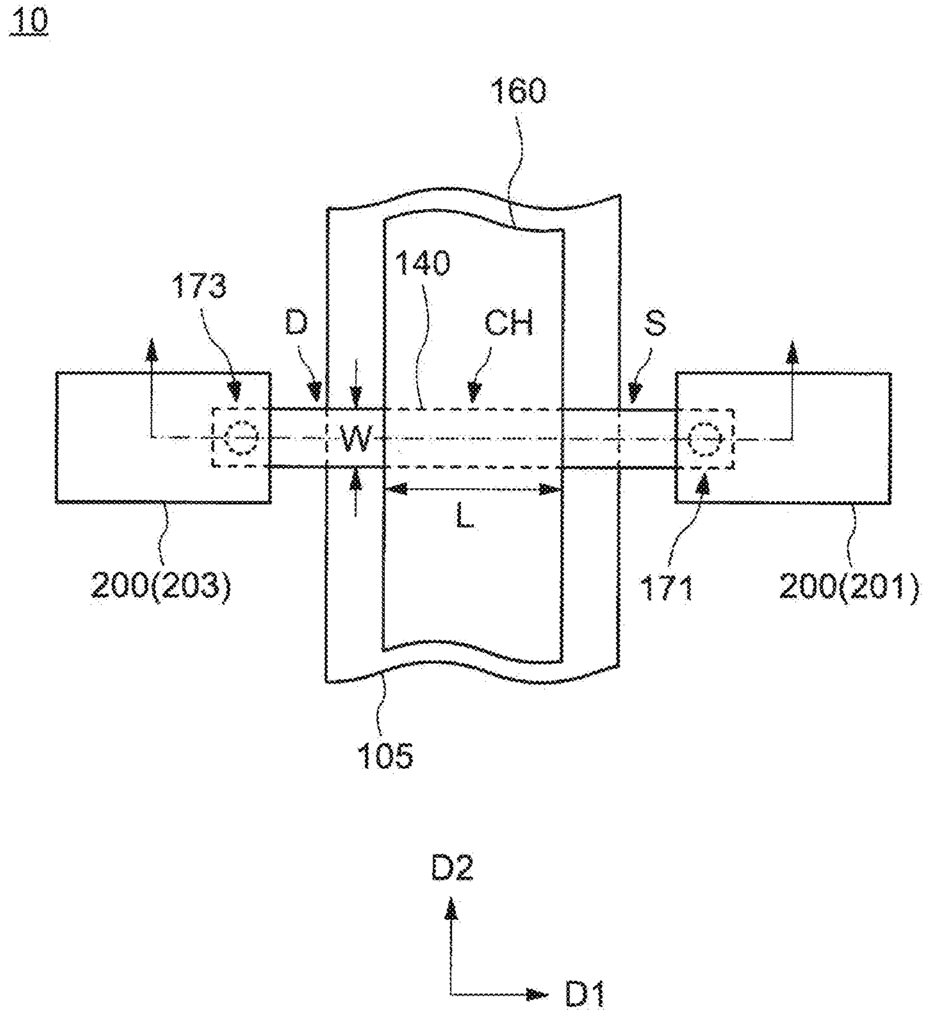
FIG. 2 is a plan view showing an outline of a semiconductor device according to an embodiment of the present invention.

A configuration of a semiconductor device 10 according to an embodiment of the present invention will be described with reference to FIG. 1 and FIG. 2. FIG. 1 is a cross-sectional view showing an outline of a semiconductor device according to an embodiment of the present invention. FIG. 2 is a plan view showing an outline of a semiconductor device according to an embodiment of the present invention.

As shown in FIG. 1, the semiconductor device 10 is arranged above a substrate 100. The semiconductor device 10 includes a gate electrode 105, gate insulating layers 110 and 120, a metal oxide layer 130, an oxide semiconductor layer 140, a gate insulating layer 150, a gate electrode 160, insulating layers 170 and 180, a source electrode 201, and a drain electrode 203. If the source electrode 201 and the drain electrode 203 are not specifically distinguished from each other, they may be referred to as a source-drain electrode 200.

The gate electrode 105 is arranged on the substrate 100. The gate insulating layers 110 and 120 are arranged on the substrate 100 and the gate electrode 105. The metal oxide layer 130 is arranged on the gate insulating layer 120. The metal oxide layer 130 is in contact with the gate insulating layer 120. The oxide semiconductor layer 140 is arranged on the metal oxide layer 130. The oxide semiconductor layer 140 is in contact with the metal oxide layer 130. The oxide semiconductor layer 140 is patterned. Part of the metal oxide layer 130 extends outside the pattern of the oxide semiconductor layer 140 beyond the end portion of the oxide semiconductor layer 140. However, the metal oxide layer 130 may be patterned in the same planar shape as the oxide semiconductor layer 140.

The thickness of the metal oxide layer 130 is 1 nm or more and 4 nm or less, or 1 nm or more and 3 nm or less. The ratio of the thickness of the metal oxide layer 130 with respect to the thickness of the oxide semiconductor layer 140 is 1/30 or more and 4/30 or less, or 1/30 or more and 1/10 or less. Although details will be described later, a semiconductor device having high mobility and high reliability can be realized by setting the thickness of the metal oxide layer 130 to the above-described range.

In other words, the gate insulating layer 120 is arranged between the substrate 100 and the metal oxide layer 130. In other words, the metal oxide layer 130 is in contact with each of the gate insulating layer 120 and the oxide semiconductor layer 140 between the gate insulating layer 120 and the oxide semiconductor layer 140. Although details will be described later, the gate insulating layer 120 is an insulating layer containing oxygen. Specifically, the gate insulating layer 120 is an insulating layer having a function of releasing oxygen by heat treatment at 600° C. or lower. Oxygen released from the gate insulating layer 120 by the heat treatment repairs oxygen vacancies formed in the oxide semiconductor layer 140. The gate insulating layer 120 may be referred to as a "first insulating layer."

In the present embodiment, no semiconductor layer or oxide semiconductor layer is arranged between the metal oxide layer 130 and the substrate 100.

In the present embodiment, although a configuration in which the metal oxide layer 130 is in contact with the gate insulating layer 120 and the oxide semiconductor layer 140 is in contact with the metal oxide layer 130 is exemplified, the configuration is not limited to this configuration. Another layer may be arranged between the gate insulating layer 120 and the metal oxide layer 130. Another layer may be arranged between the metal oxide layer 130 and the oxide semiconductor layer 140.

The gate electrode 160 faces the oxide semiconductor layer 140. The gate insulating layer 150 is arranged between the oxide semiconductor layer 140 and the gate electrode 160. The gate insulating layer 150 is in contact with the oxide semiconductor layer 140. A surface of the main surfaces of the oxide semiconductor layer 140 that is in contact with the gate insulating layer 150 is referred to as an upper surface 141. A surface of the main surfaces of the oxide semiconductor layer 140 that is in contact with the metal oxide layer 130 is referred to as an lower surface 142. A surface between the upper surface 141 and the lower surface 142 is referred to as a side surface 143. The insulating layers 170 and 180 are arranged above the gate insulating layer 150 and the gate electrode 160. Openings 171 and 173 that reach the oxide semiconductor layer 140 are arranged in the insulating layers 170 and 180. The source electrode 201 is arranged inside the opening 171. The source electrode 201 is in contact with the oxide semiconductor layer 140 at the bottom of the opening 171. The drain electrode 203 is arranged inside the opening 173. The drain electrode 203 is in contact with the oxide semiconductor layer 140 at the bottom of the opening 173.

The gate electrode 105 has a function as a bottom-gate of the semiconductor device 10 and a function as a light-shielding film for the oxide semiconductor layer 140. The gate insulating layer 110 has a function as a barrier film for shielding impurities that diffuse from the substrate 100 toward the oxide semiconductor layer 140. The gate insulating layers 110 and 120 have a function as a gate insulating layer for the bottom-gate. The metal oxide layer 130 is a layer containing a metal oxide containing aluminum as the main component, and has a function as a gas barrier property film for shielding a gas such as oxygen and hydrogen.

The oxide semiconductor layer 140 is divided into a source region S, a drain region D, and a channel region CH. The channel region CH is a region of the oxide semiconductor layer 140 vertically below the gate electrode 160. The source region S is a region of the oxide semiconductor layer 140 that does not overlap the gate electrode 160 in a plan view and is closer to the source electrode 201 than the channel region CH. The drain region D is a region of the oxide semiconductor layer 140 that does not overlap the gate electrode 160 in a plan view and is closer to the drain electrode 203 than the channel region CH. The oxide semiconductor layer 140 in the channel region CH has physical properties as a semiconductor. The oxide semiconductor layer 140 in the source region S and the drain region D has physical properties as a conductor.

The gate electrode 160 has a function as a top-gate of the semiconductor device 10 and a light-shielding film for the oxide semiconductor layer 140. The gate insulating layer 150 has a function as a gate insulating layer for the top-gate, and has a function of releasing oxygen by a heat treatment in a manufacturing process similar to the gate insulating layer 120. The insulating layers 170 and 180 insulate the gate electrode 160 and the source-drain electrode 200 and have a function of reducing parasitic capacitance therebetween. Operations of the semiconductor device 10 are controlled mainly by a voltage supplied to the gate electrode 160. An auxiliary voltage is supplied to the gate electrode 105. However, in the case of using the gate electrode 105 simply as a light-shielding film, a specific voltage is not supplied to the gate electrode 105, and a potential of the gate electrode 105 may be in a floating. That is, the gate electrode 105 may simply be referred to as a "light-shielding film." In the case mentioned above, the shielding film may be an insulator.

In the present embodiment, although a configuration using a dual-gate transistor in which the gate electrode is arranged both above and below the oxide semiconductor layer as the semiconductor device 10 is exemplified, the configuration is not limited to this configuration. For example, a bottom-gate transistor in which the gate electrode is arranged only below the oxide semiconductor layer or a top-gate transistor in which the gate electrode is arranged only above the oxide semiconductor layer may be used as the semiconductor device 10. The above configuration is merely an embodiment, and the present invention is not limited to the above configuration.

Referring to FIG. 1 and FIG. 2, the lower surface 142 of the oxide semiconductor layer 140 is covered with the metal oxide layer 130. In particular, in the present embodiment, all of the lower surface 142 of the oxide semiconductor layer 140 is covered with the metal oxide layer 130. In a direction D1 shown in FIG. 2, a width of the gate electrode 105 is greater than a width of the gate electrode 160. The direction D1 is a direction connecting the source electrode 201 and the drain electrode 203, and is a direction indicating a channel length L of the semiconductor device 10. Specifically, a length in the direction D1 in the region (the channel region CH) where the oxide semiconductor layer 140 and the gate electrode 160 overlap is the channel length L, and a width in a direction D2 in the channel region CH is a channel width W.

In the present embodiment, although a configuration in which all of the lower surface 142 of the oxide semiconductor layer 140 is covered with the metal oxide layer 130 is exemplified, the present invention is not limited to this configuration. For example, part of the lower surface 142 of the oxide semiconductor layer 140 may not be in contact with the metal oxide layer 130. For example, all of the lower surface 142 of the oxide semiconductor layer 140 in the channel region CH may be covered with the metal oxide layer 130, and all or part of the lower surface 142 of the oxide semiconductor layer 140 in the source region S and the drain region D may not be covered with the metal oxide layer 130. That is, all or part of the lower surface 142 of the oxide semiconductor layer 140 in the source region S and the drain region D may not be in contact with the metal oxide layer 130. However, in the above configuration, part of the lower surface 142 of the oxide semiconductor layer 140 in the channel region CH may not be covered with the metal oxide layer 130, and the other part of the lower surface 142 may be in contact with the metal oxide layer 130.

In the present embodiment, although a configuration in which the gate insulating layer 150 is formed on the entire surface and the openings 171 and 173 are arranged in the gate insulating layer 150 is exemplified, the configuration is not limited to this configuration. The gate insulating layer 150 may be patterned in a shape that is different from the shape in which the openings 171 and 173 are arranged. For example, the gate insulating layer 150 may be patterned to expose all or part of the oxide semiconductor layer 140 in the source region S and the drain region D. That is, the gate insulating layer 150 in the source region S and the drain region D may be removed, and the oxide semiconductor layer 140 and the insulating layer 170 may be in contact with each other in these regions.

In FIG. 2, although a configuration in which the source-drain electrode 200 does not overlap the gate electrode 105 and the gate electrode 160 in a plan view is exemplified, the configuration is not limited to this configuration. For example, in a plan view, the source-drain electrode 200 may overlap at least one of the gate electrode 105 and the gate electrode 160. The above configuration is merely an embodiment, and the present invention is not limited to the above configuration.

[1-2. Material of Each Member of Semiconductor Device 10]

A rigid substrate having translucency, such as a glass substrate, a quartz substrate, a sapphire substrate, or the like, is used as the substrate 100. In the case where the substrate 100 needs to have flexibility, a substrate containing a resin such as a polyimide substrate, an acryl substrate, a siloxane substrate, or a fluororesin substrate is used as the substrate 100. In the case where the substrate containing a resin is used as the substrate 100, impurities may be introduced into the resin in order to improve the heat resistance of the substrate 100. In particular, in the case where the semiconductor device 10 is a top-emission display, since the substrate 100 does not need to be transparent, impurities that deteriorate the translucency of the substrate 100 may be used. In the case where the semiconductor device 10 is used for an integrated circuit that is not a display device, a substrate without translucency such as a semiconductor substrate such as a silicon substrate, a silicon carbide substrate, a compound semiconductor substrate, or a conductive substrate such as a stainless substrate is used as the substrate 100.

Common metal materials are used for the gate electrode 105, the gate electrode 160, and the source-drain electrode 200. For example, aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag), copper (Cu), and alloys thereof or compounds thereof are used as these members. The above-described materials may be used in a single layer or in a stacked layer as the gate electrode 105, the gate electrode 160, and the source-drain electrode 200.

Common insulating materials are used for the gate insulating layers 110 and 120 and the insulating layers 170 and 180. For example, inorganic insulating layers such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), and aluminum nitride ($AlN_x$) are used as the insulating layers.

Among the above-described insulating layers, the insulating layer containing oxygen is used as the gate insulating layer 150. For example, an inorganic insulating layer such as silicon oxide ($SiO_x$), silicon oxynitride ($SiO_xN_y$), aluminum oxide ($AlO_x$), and aluminum oxynitride ($AlO_xN_y$) is used as the gate insulating layer 150.

An insulating layer having a function of releasing oxygen by a heat treatment is used as the gate insulating layer 120. For example, the temperature of the heat treatment at which the gate insulating layer 120 releases oxygen is 600° C. or less, 500° C. or less, 450° C. or less, or 400° C. or less. That is, for example, in the case where the glass substrate is used as the substrate 100, the gate insulating layer 120 releases oxygen at the heat treatment temperature performed in the manufacturing process of the semiconductor device 10. An insulating layer having a function releasing oxygen similar to the gate insulating layer 120 by a heat treatment is used as at least one of the insulating layers 170 and 180.

An insulating layer with few defects is used as the gate insulating layer 150. For example, when a composition ratio of oxygen in the gate insulating layer 150 is compared with a composition ratio of oxygen in an insulating layer (hereinafter referred to as "other insulating layer") having a composition similar to that of the gate insulating layer 150, the composition ratio of oxygen in the gate insulating layer 150 is closer to the stoichiometric ratio with respect to the insulating layer than the composition ratio of oxygen in that other insulating layer. Specifically, in the case where silicon oxide ($SiO_x$) is used for each of the gate insulating layer 150 and the insulating layer 180, the composition ratio of oxygen in the silicon oxide used as the gate insulating layer 150 is close to the stoichiometric ratio of silicon oxide as compared with the composition ratio of oxygen in the silicon oxide used as the insulating layer 180. For example, a layer in which no defects are observed when evaluated by the electron-spin resonance (ESR) may be used as the gate insulating layer 150.

$SiO_xN_y$ and $AlO_xN_y$ described above are a silicon compound and an aluminum compound containing nitrogen (N) in a ratio (x>y) smaller than that of oxygen (O). $SiN_xO_y$ and $AlN_xO_y$ are a silicon compound and an aluminum compound containing oxygen in a ratio (x>y) smaller than that of nitrogen.

A metal oxide containing aluminum as the main component is used as the metal oxide layer 130. For example, an inorganic insulating layer such as aluminum oxide ($AlO_x$), aluminum oxynitride ($AlO_xN_y$), aluminum nitride oxide ($AlN_xO_y$), or aluminum nitride ($AlN_x$) is used as the metal oxide layer 130. The "metal oxide layer containing aluminum as the main component" means that the ratio of aluminum contained in the metal oxide layer 130 is 1% or more of the total amount of the metal oxide layer 130. The ratio of aluminum contained in the metal oxide layer 130 may be 5% or more and 70% or less, 10% or more and 60% or less, or 30% or more and 50% or less of the total amount of the metal oxide layer 130. The above ratio may be a mass ratio or a weight ratio.

A metal oxide having semiconductor properties may be used as the oxide semiconductor layer 140.

The oxide semiconductor layer 140 may be amorphous or crystalline. The oxide semiconductor layer 140 may be a mixed phase of amorphous and crystal.

In the oxide semiconductor layer 140, when the oxygen contained in the oxide semiconductor layer 140 is reduced, an oxygen vacancy is formed in the oxide semiconductor layer 140. In the semiconductor device 10, oxygen vacancies occur in the oxide semiconductor layer 140 when hydrogen is released from the layer (for example, the gate insulating layers 110 and 120) arranged closer to the substrate 100 than the oxide semiconductor layer 140 and the hydrogen reaches the oxide semiconductor layer 140 in a heat treatment step of a manufacturing process. The occurrence of oxygen vacancies is more significant as the pattern size of the oxide semiconductor layer 140 is larger. In order to suppress the occurrence of such oxygen vacancies, it is necessary to suppress hydrogen from reaching the lower surface 142 of the oxide semiconductor layer 140.

On the other hand, the upper surface 141 of the oxide semiconductor layer 140 is affected by a process (for example, a patterning process or an etching process) after the oxide semiconductor layer 140 is formed. In contrast, the lower surface 142 of the oxide semiconductor layer 140 (the surface of the oxide semiconductor layer 140 on the substrate 100 side) is not affected as described above.

Therefore, there are more oxygen vacancies formed near the upper surface 141 of the oxide semiconductor layer 140 than the oxygen vacancies formed near the lower surface 142 of the oxide semiconductor layer 140. That is, the oxygen vacancies in the oxide semiconductor layer 140 do not exist uniformly in a thickness direction of the oxide semiconductor layer 140, but exist in a non-uniform distribution in the thickness direction of the oxide semiconductor layer 140. Specifically, there are fewer oxygen vacancies in the oxide semiconductor layer 140 toward the lower surface 142 side of the oxide semiconductor layer 140 and more oxygen vacancies toward the upper surface 141 side of the oxide semiconductor layer 140.

In the case where an oxygen supply process is uniformly performed on the oxide semiconductor layer 140 having the oxygen vacancy distribution as described above, oxygen is excessively supplied to the lower surface 142 side of the oxide semiconductor layer 140 when supplying oxygen in an amount required to repair the oxygen vacancies formed on the upper surface 141 side of the oxide semiconductor layer 140. As a result, a defect level different from the oxygen vacancies is formed on the lower surface 142 side due to the excess oxygen. As a result, phenomenon such as variation in characteristics in the reliability test or a decrease in field-effect mobility occurs. Therefore, in order to suppress such phenomenon, it is necessary to supply oxygen to the upper surface 141 side of the oxide semiconductor layer 140 while suppressing the oxygen supply to the lower surface 142 side of the oxide semiconductor layer 140.

The above problems are newly recognized in the process of reaching the present invention but are not problems that have been conventionally recognized. In the conventional configuration and manufacturing method, there was a trade-off relationship between the initial characteristics and the reliability test, in which the variation in characteristics according to the reliability test occurs even when the initial characteristics of the semiconductor device are improved by the oxygen supply process to the oxide semiconductor layer. However, with the configuration according to the present embodiment, the above problems are solved, and it is possible to obtain good initial characteristics and a reliability test result of the semiconductor device 10.

In order to solve the above problem, the metal oxide layer 130 is arranged between the gate insulating layer 120 and the oxide semiconductor layer 140. Further, since the thickness of the metal oxide layer 130 is 1 nm or more and 4 nm or less or 1 nm or more and 3 nm or less, a semiconductor device having high mobility and high reliability can be realized.

[1-3. Method for Manufacturing Semiconductor Device 10]

Figure 3:
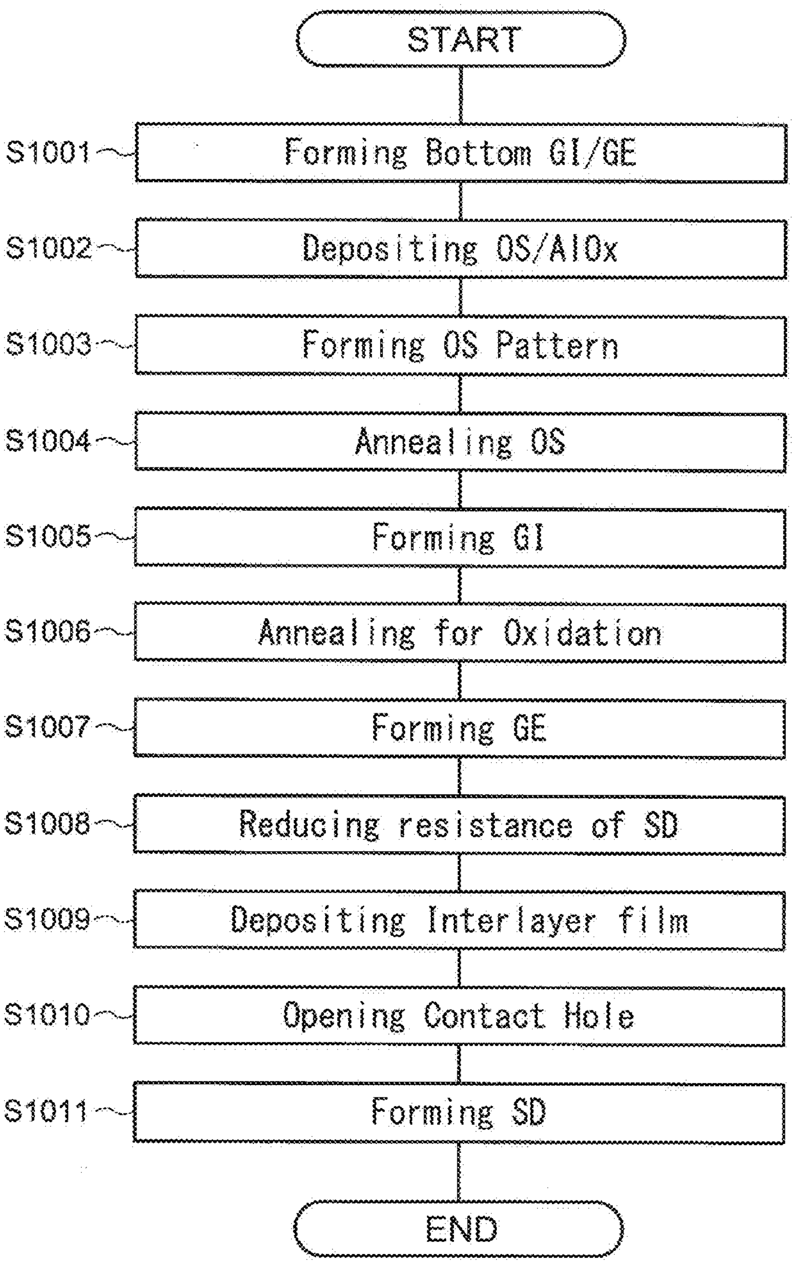
FIG. 3 is a sequence diagram showing a method for manufacturing a semiconductor device according to an embodiment of the present invention.

A method for manufacturing a semiconductor device according to an embodiment of the present invention will be described with reference to FIG. 3 to FIG. 10. FIG. 3 is a sequence diagram showing a method for manufacturing a semiconductor device according to an embodiment of the present invention. FIG. 4 to FIG. 10 are cross-sectional views showing a method for manufacturing a semiconductor device according to an embodiment of the present invention. In the description of the manufacturing method shown below, a method for manufacturing the semiconductor device 10 in which aluminum oxide is used as the metal oxide layers 130 will be described.

Figure 4:
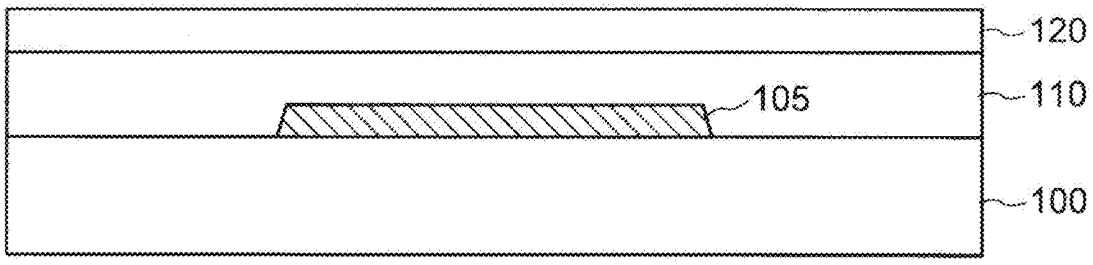
FIG. 4 is a cross-sectional view showing a method for manufacturing a semiconductor device according to an embodiment of the present invention.

As shown in FIG. 3 and FIG. 4, the gate electrode 105 is formed on the substrate 100 as the bottom-gate, and the gate insulating layers 110 and 120 are formed on the gate electrode 105 ("Forming Bottom GI/GE" in step S1001 of FIG. 3). For example, silicon nitride is formed as the gate insulating layer 110. For example, silicon oxide is formed as the gate insulating layer 120. The gate insulating layers 110 and 120 are formed by a CVD (Chemical Vapor Deposition) method.

Using silicon nitride as the gate insulating layer 110 allows the gate insulating layer 110 to block impurities that diffuse, for example, from the substrate 100 toward the oxide semiconductor layer 140. The silicon oxide used as the gate insulating layer 120 is silicon oxide having a physical property of releasing oxygen by a heat treatment.

Figure 5:
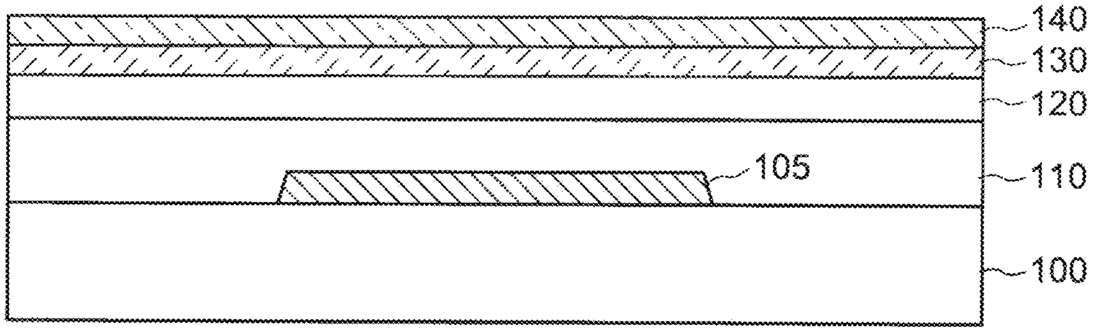
FIG. 5 is a cross-sectional view showing a method for manufacturing a semiconductor device according to an embodiment of the present invention.

As shown in FIG. 3 and FIG. 5, the metal oxide layer 130 and the oxide semiconductor layer 140 are formed on the gate insulating layer 120 ("Depositing OS/$AlO_x$" in step S1002 of FIG. 3). The metal oxide layer 130 and the oxide semiconductor layer 140 are deposited by a sputtering method or an atomic layer deposition method (ALD).

For example, the thickness of the metal oxide layer 130 is 1 nm or more and 4 nm or less or 1 nm or more and 3 nm or less. Since the thickness of the metal oxide layer 130 is very small, it is necessary to keep the deposition rate of the metal oxide layer 130 low. For this reason, it is preferable to set the deposition power as low as possible and set the oxygen partial pressure in a process gas at the time of deposition to be high. For example, in the case of sputtering deposition, the deposition rate of the metal oxide layer 130 is 0.04 nm/sec to 0.3 nm/sec. Similarly, in the case of ALD, the deposition rate of the metal oxide layer 130 is 0.005 nm/sec to 0.01 nm/sec. In the present embodiment, aluminum oxide is used as the metal oxide layer 130. Aluminum oxide has a high barrier property against gas. In the present embodiment, the aluminum oxide used as the metal oxide layer 130 blocks some of the hydrogen and oxygen released from the gate insulating layer 120 and regulates the quantity of the released hydrogen and oxygen reaching the oxide semiconductor layer 140.

For example, the thickness of the oxide semiconductor layer 140 is 10 nm or more and 100 nm or less, 15 nm or more and 70 nm or less, or 20 nm or more and 40 nm or less. In the present embodiment, the thickness of the oxide semiconductor layer 140 is 30 nm. The oxide semiconductor layer 140 before the heat treatment (OS anneal), which will be described later, is amorphous.

For example, in the case where the oxide semiconductor layer 140 is deposited by the sputtering method, the oxide semiconductor layer 140 is deposited in a state where the temperature of the object to be deposited (the substrate 100 and structures formed thereon) is controlled.

In the case where the deposition is performed on the object to be deposited by the sputtering method, ions generated in the plasma and atoms recoiled by a sputtering target collide with the object to be deposited. Therefore, the temperature of the object to be deposited rises with the deposition process. For example, in order to control the temperature of the object to be deposited as described above, deposition may be performed while cooling the object to be deposited. For example, the object to be deposited may be cooled from a surface opposite to a deposited surface so that the temperature of the deposited surface of the object to be deposited (hereinafter, referred to as "deposition temperature") is 100° C. or less, 70° C. or less, 50° C. or less, or 30° C. or less. In addition, in the case where amorphous oxide semiconductor films are used as active layer in a thin film transistor, the temperature control during film deposition mentioned above is not necessary.

Figure 6:
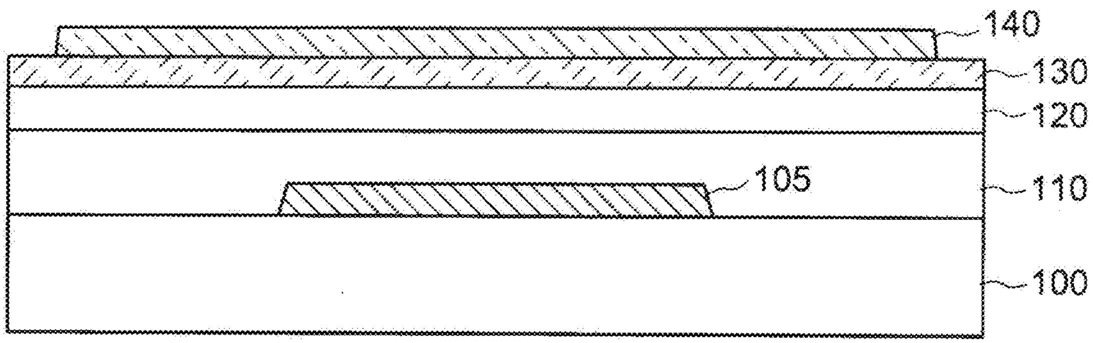
FIG. 6 is a cross-sectional view showing a method for manufacturing a semiconductor device according to an embodiment of the present invention.

As shown in FIG. 3 and FIG. 6, a pattern of the oxide semiconductor layer 140 is formed ("Forming OS Pattern" in step S1003 of FIG. 3). Although not shown, a resist mask is formed on the oxide semiconductor layer 140, and the oxide semiconductor layer 140 is etched using the resist mask. Wet etching may be used, or dry etching may be used as the etching method of the oxide semiconductor layer 140. The wet etching may include etching using an acidic etchant. For example, oxalic acid or hydrofluoric acid may be used as the etchant.

A heat treatment (OS anneal) ("Annealing OS" in step S1004 of FIG. 3) is performed on the oxide semiconductor layer 140 after the pattern of the oxide semiconductor layer 140 is formed. In the present embodiment, the oxide semiconductor layer 140 is crystallized by the OS anneal. However, the oxide semiconductor layer 140 does not have to be crystallized by the OS anneal.

In the present embodiment, although a manufacturing method in which only the oxide semiconductor layer 140 is patterned has been exemplified, the manufacturing method is not limited to this. For example, the pattern of the metal oxide layer 130 may be substantially the same as the pattern of the oxide semiconductor layer 140. In the case where the oxide semiconductor layer 140 is crystallized by the OS anneal, the metal oxide layer 130 may be patterned by etching the metal oxide layer 130 using the oxide semiconductor layer 140 as a mask. On the other hand, in the case where the oxide semiconductor layer 140 is amorphous even after the OS anneal, the metal oxide layer 130 may be patterned by etching the metal oxide layer 130 using the resist used for patterning the oxide semiconductor layer 140 as a mask.

Figure 7:
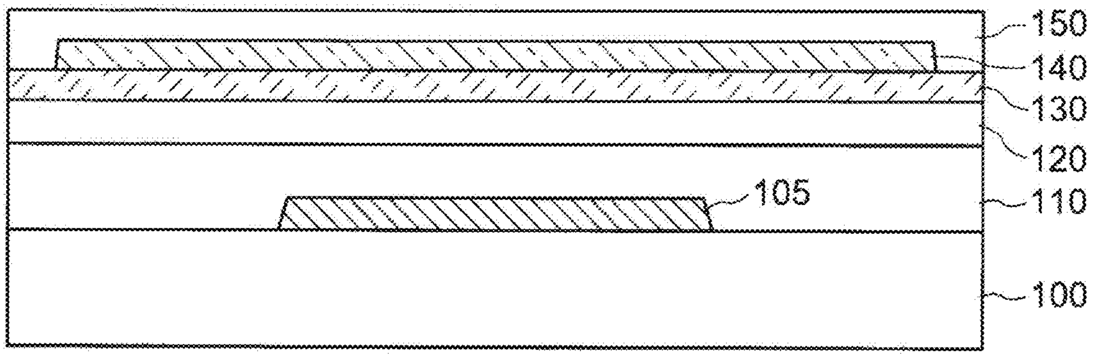
FIG. 7 is a cross-sectional view showing a method for manufacturing a semiconductor device according to an embodiment of the present invention.

As shown in FIG. 3 and FIG. 7, a gate insulating layer 150 is formed ("Forming GI" in step S1005 of FIG. 3). For example, silicon oxide is formed as the gate insulating layer 150. The gate insulating layer 150 is formed by the CVD method. For example, the gate insulating layer 150 may be deposited at a deposition temperature of 350° C. or higher in order to form the insulating layer having few defects as described above as the gate insulating layer 150. For example, the thickness of the gate insulating layer 150 is 50 nm or more and 300 nm or less, 60 nm or more and 200 nm or less, or 70 nm or more and 150 nm or less. The gate insulating layer 150 is formed, and then treatment for implanting oxygen into the gate insulating layer 150 may be performed.

Heat treatment (oxidation annealing) is performed to supply oxygen to the oxide semiconductor layer 140 with the gate insulating layer 150 deposited on the oxide semiconductor layer 140 ("Annealing for Oxidation" in step S1006 of FIG. 3). In the process from the deposition of the oxide semiconductor layer 140 to the deposition of the gate insulating layer 150 on the oxide semiconductor layer 140, a large amount of oxygen vacancies occurs in the upper surface 141 and the side surface 143 of the oxide semiconductor layer 140. Oxygen released from the gate insulating layers 120 and 150 is supplied to the oxide semiconductor layer 140 by the above-described oxidation annealing, and the oxygen vacancies are repaired. If the process of implanting oxygen into the gate insulating layer 150 is not performed, the oxidation annealing is performed on the gate insulating layer 150 with the insulating layer that releases oxygen by heat treatment is formed.

Since some of the oxygen emitted from the gate insulating layer 120 is blocked by the metal oxide layer 130 due to the oxidation annealing, oxygen is not easily supplied to the lower surface 142 of the oxide semiconductor layer 140. On the other hand, the oxygen emitted from the gate insulating layer 150 is supplied to the upper surface 141 and the side surface 143 of the oxide semiconductor layer 140. The oxidation annealing may release hydrogen from the gate insulating layers 110 and 120, which is blocked by the metal oxide layer 130.

As described above, the process of oxidation annealing makes it possible to supply oxygen to the upper surface 141 and the side surface 143 of the oxide semiconductor layer 140 having a large amount of oxygen vacancies while suppressing the supply of oxygen to the lower surface 142 of the oxide semiconductor layer 140 having a small amount of oxygen vacancies.

In order to increase the amount of oxygen supplied from the gate insulating layer 150, a metal oxide layer similar to the metal oxide layer 130 may be formed on the gate insulating layer 150 by a sputtering method, thereby adding a step of implanting oxygen into the gate insulating layer 150. Further, the above-described oxidation annealing may be performed while the metal oxide layer is formed on the gate insulating layer 150. Aluminum oxide having a high barrier property against gas is used as the metal oxide layer, so that it is possible to suppress oxygen implanted into the gate insulating layer 150 from being diffused outward at the time of oxidation annealing.

Figure 8:
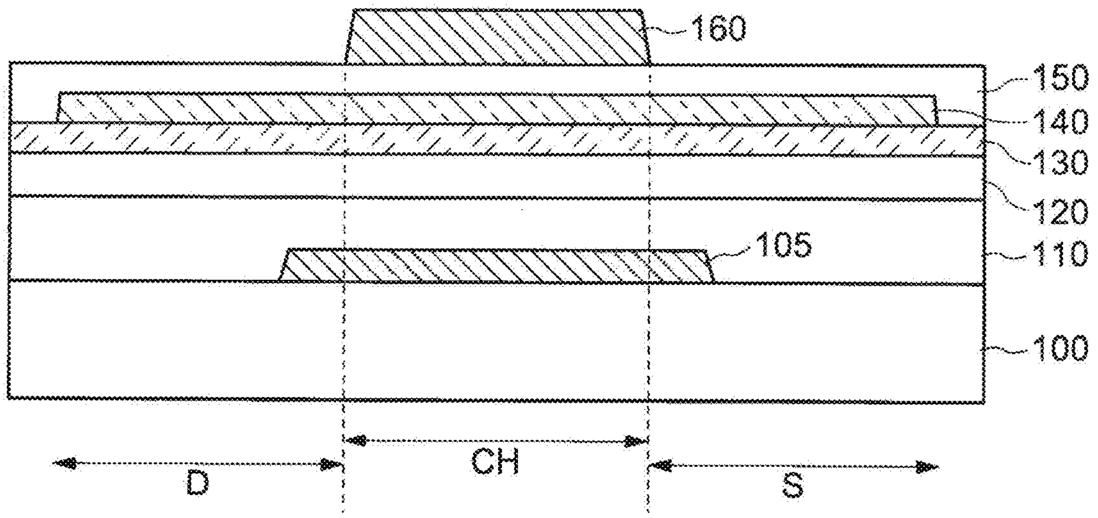
FIG. 8 is a cross-sectional view showing a method for manufacturing a semiconductor device according to an embodiment of the present invention.

As shown in FIG. 3 and FIG. 8, a gate electrode 160 is formed ("Forming GE" in step S1007 of FIG. 3). The gate electrode 160 is formed by a sputtering method or an atomic-layer deposition method, and is patterned through a photolithography process.

Resistances of the source region S and the drain region D of the oxide semiconductor layer 140 are reduced ("Reducing resistance of SD" in step S1008 of FIG. 3) in a state where the gate electrode 160 is patterned. Specifically, impurities are implanted into the oxide semiconductor layer 140 from the gate electrode 160 side via the gate insulating layer 150 by ion implantation. For example, argon (Ar), phosphorus (P), and boron (B) are implanted into the oxide semiconductor layer 140 by the ion implantation. Oxygen vacancies are formed in the oxide semiconductor layer 140 by the ion implantation, thereby reducing the resistance of the oxide semiconductor layer 140. Since the gate electrode 160 is arranged above the oxide semiconductor layer 140 functioning as the channel region CH of the semiconductor device 10, impurities are not implanted into the oxide semiconductor layer 140 in the channel region CH.

Figure 9:
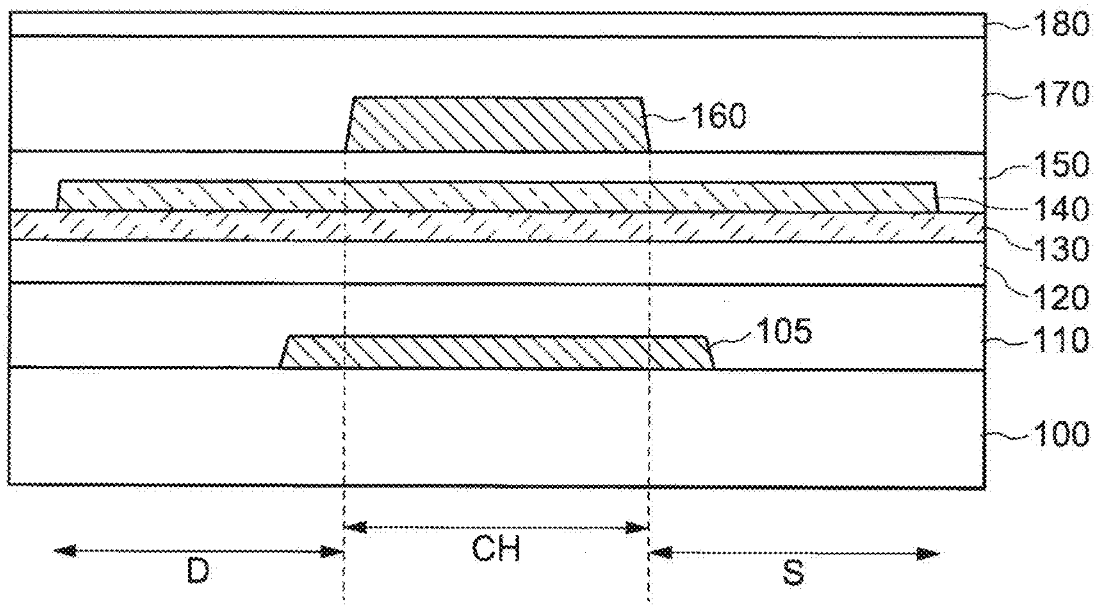
FIG. 9 is a cross-sectional view showing a method for manufacturing a semiconductor device according to an embodiment of the present invention.

As shown in FIG. 3 and FIG. 9, the insulating layers 170 and 180 are deposited on the gate insulating layer 150 and the gate electrode 160 as interlayer films ("Depositing Interlayer film" in step S1009 of FIG. 3). The insulating layers 170 and 180 are deposited by the CVD method. For example, silicon nitride is formed as the insulating layer 170, and silicon oxide is formed as the insulating layer 180. The materials used as the insulating layers 170 and 180 are not limited to the above. A thickness of the insulating layer 170 is 50 nm or more and 500 nm or less. A thickness of the insulating layer 180 is 50 nm or more and 500 nm or less.

Figure 10:
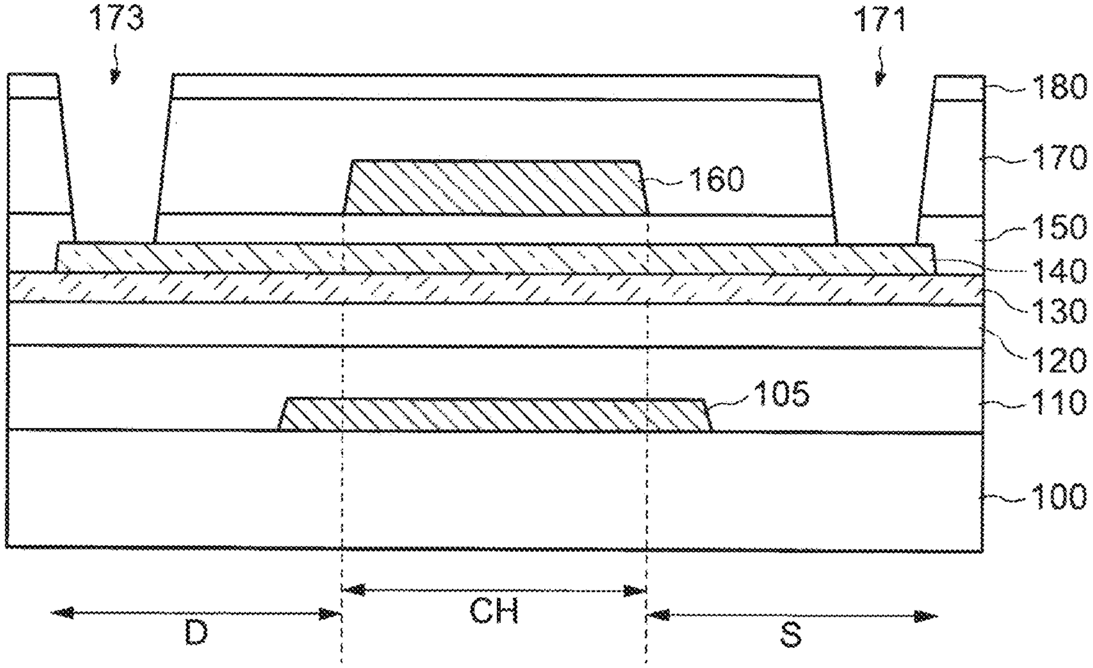
FIG. 10 is a cross-sectional view showing a method for manufacturing a semiconductor device according to an embodiment of the present invention.

As shown in FIG. 3 and FIG. 10, the openings 171 and 173 are formed in the gate insulating layer 150 and the insulating layers 170 and 180 ("Opening Contact Hole" in step S1010 of FIG. 3). The oxide semiconductor layer 140 in the source region S is exposed by the opening 171. The oxide semiconductor layer 140 in the drain region D is exposed by the opening 173. The semiconductor device 10 shown in FIG. 1 is completed by forming the source-drain electrode 200 on the oxide semiconductor layer 140 exposed by the openings 171 and 173 and on the insulating layer 180 ("Forming SD" in step S1011 of FIG. 3).

With respect to the semiconductor device 10 manufactured by the above-described manufacturing method, it is possible to obtain electrical characteristics having a mobility of 30 [$cm^2/Vs$] or more, 35 [$cm^2/Vs$] or more, or 40 [$cm^2/Vs$] or more in a range where the channel length L of the channel region CH is 2 μm or more and 4 μm or less and the channel width of the channel region CH is 2 μm or more and 25 μm or less. The mobility in the present embodiment is the field-effect mobility in a saturation region in the electrical characteristics of the semiconductor device 10. Specifically, the mobility means the largest value of the field-effect mobility in area region where a potential difference (Vd) between the source electrode and the drain electrode is greater than a value (Vg-Vth) that a threshold-voltage (Vth) of the semiconductor device 10 is subtracted from a voltage (Vg) supplied to the gate electrode.

[1-4. Electrical Characteristics of Semiconductor Device 10]

The electrical characteristics and reliability test results of the semiconductor device 10 according to the embodiment will be described with reference to FIG. 11 to FIG. 14.

Figure 11:
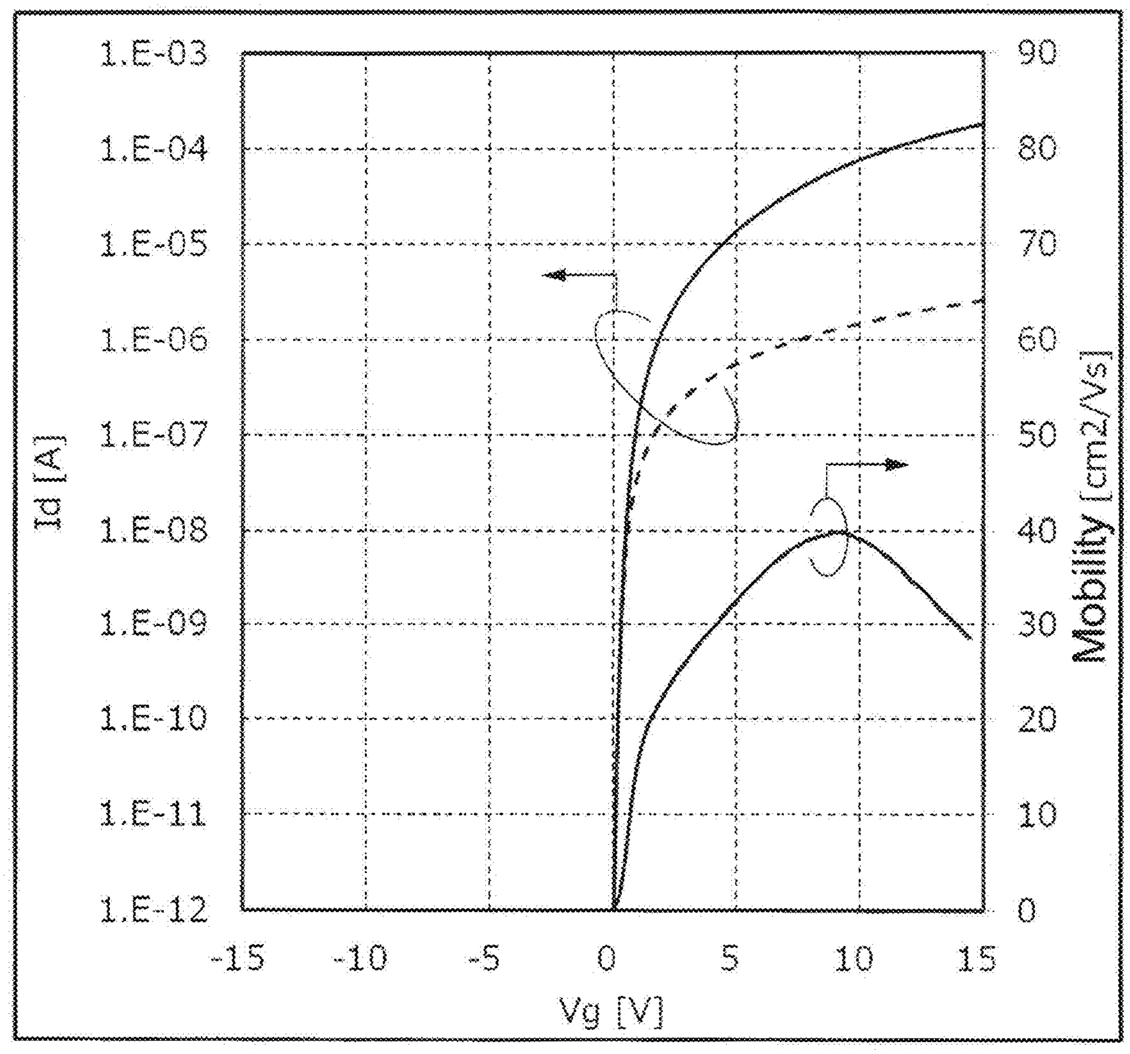
FIG. 11 is a diagram showing the electrical characteristics of a semiconductor device according to an embodiment of the present invention.

The FIG. 11 is a diagram showing the electrical characteristics of a semiconductor device according to an embodiment of the present invention. The measurement conditions for the electrical characteristics shown in FIG. 11 are as follows.

Size of the channel region CH: W/L=4.5 μm/3.0 μm

Source and drain voltage: 0.1 V (dotted line), 10 V (solid line)·

Gate voltage: −15 V to +15 V

Measurement environment: room temperature, dark room

The electrical characteristics (Id-Vg characteristics) and mobility of the semiconductor device 10 are shown in FIG. 11. As indicated by arrows in the graphs of FIG. 11, the vertical axis for a drain current (Id) is shown on the left side of the graph, and the vertical axis for the mobility calculated from the drain current is shown on the right side of the graph.

As shown in FIG. 11, the electrical characteristics of the semiconductor device 10 according to the present embodiment exhibit so-called normally-off characteristics in which the drain current Id begins to flow when the gate voltage Vg is higher than 0 V. The mobility calculated from the electrical characteristics is about 40 [$cm^2/Vs$].

Figure 12:
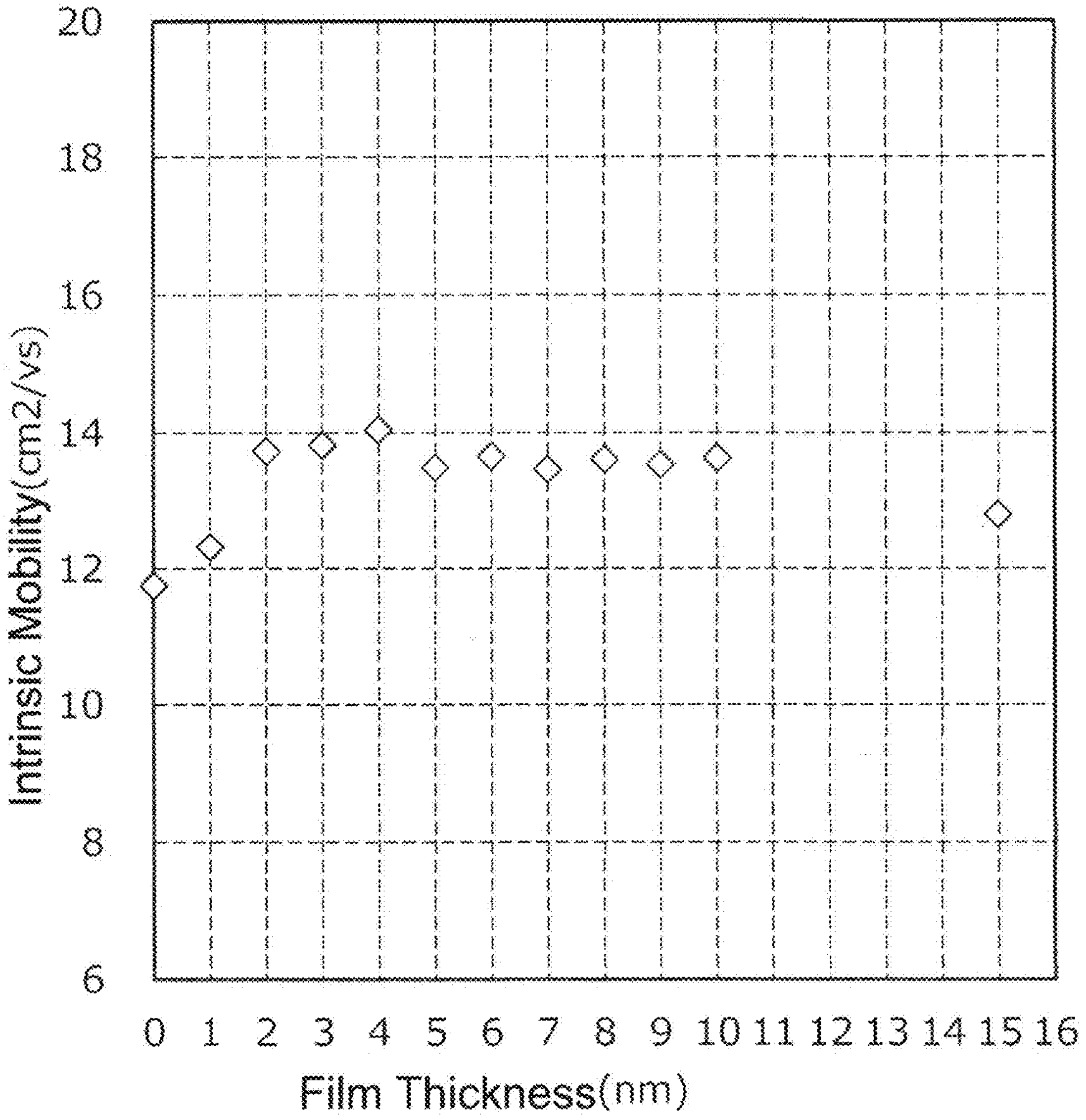
FIG. 12 is a diagram showing a film thickness dependence of the intrinsic mobility of a semiconductor device according to an embodiment of the present invention.

FIG. 12 is a diagram showing a film thickness dependence of the intrinsic mobility of a semiconductor device according to an embodiment of the present invention. FIG. 12 shows the intrinsic mobility of the semiconductor device 10 in the case where the thickness of the metal oxide layer 130 is 0 nm to 15 nm.

The intrinsic mobility indicates the mobility of the transistor with respect to an effective channel length. The intrinsic mobility is calculated from data indicating the channel length L dependence of the mobility obtained from the electrical characteristics shown in FIG. 11. Specifically, the intrinsic mobility can be calculated by performing TLM analysis on data plotted on a graph with the channel length L on the horizontal axis and the mobility on the vertical axis (L length dependency).

As shown in FIG. 12, depositing the metal oxide layer 130 with a thickness of 1 nm improves the intrinsic mobility as compared with the case where the metal oxide layer 130 is not arranged (0 nm). Further, the intrinsic mobility is further improved by forming the metal oxide layer 130 with 2 nm or more. In the case where the thickness of the metal oxide layer 130 is 2 nm to 4 nm, the intrinsic mobility increases as the thickness of the metal oxide layer 130 increases. As a result, if the metal oxide layer 130 is formed to be 1 nm or more, the intrinsic mobility can be improved. On the other hand, in the case where the thickness of the metal oxide layer 130 is 5 nm or more, the intrinsic mobility tends to be lower than in the case where the thickness is 4 nm. In the case where the thickness of the metal oxide layer 130 is 5 nm or more, the function of blocking hydrogen diffused from the gate insulating layers 110 and 120 becomes stronger, while the defective level at the interface between the metal oxide layer 130 and the oxide semiconductor layer 140 is increased. As a result, it is considered that the intrinsic mobility is reduced. However, even when the thickness of the metal oxide layer 130 is 15 nm, the intrinsic mobility is higher than when the metal oxide layer 130 is not arranged.

Figure 13:
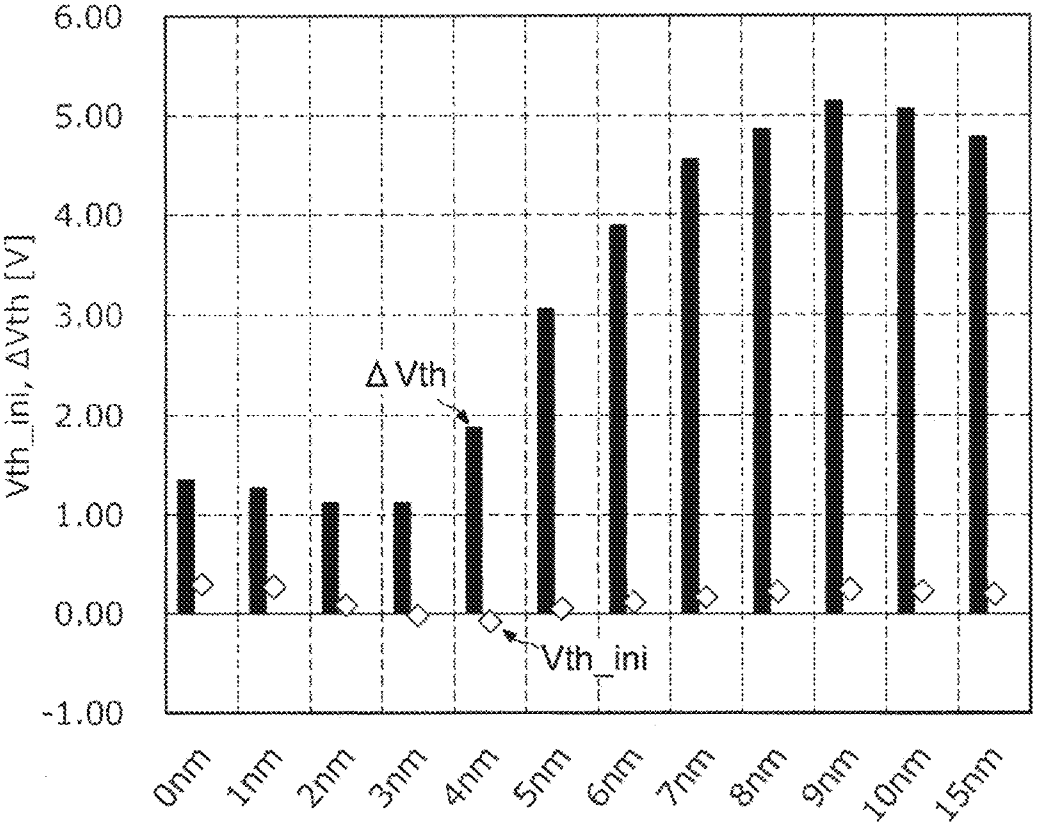
FIG. 13 is a diagram showing film thickness dependence of electrical characteristics and reliability test results of a semiconductor device according to an embodiment of the present invention.

FIG. 13 is a diagram showing film thickness dependence of electrical characteristics and reliability test results of a semiconductor device according to an embodiment of the present invention. FIG. 13 shows the electrical characteristics and the reliability test results of the semiconductor device 10 when the thickness of the metal oxide layer 130 is 0 nm to 15 nm. The electrical characteristic shown in FIG. 13 is a threshold voltage (Vth_ini) in the initial characteristic. The reliability test shown in FIG. 13 is a variation (ΔVth) of the threshold voltage according to Positive Bias Temperature Stress (PBTS). The Vth_ini is indicated by "◇". ΔVth is shown in a "bar graph".

Conditions for the PBTS reliability test are as follows.

Size of channel region CH: W/L=2. 5 μm/2.5 μm

Light irradiation condition: No irradiation (dark room)·

Gating voltage: +30 V

Source and drain voltages: 0 V

Stage temperature at the time of applying stress: 85° C.

Stress time: 1000 sec

As shown in FIG. 13, the Vth_ini is a slightly negative value when the thickness of the metal oxide layer 130 is 3 nm and 4 nm, but is a positive value otherwise. That is, in most cases, normally-off electrical characteristics are obtained. ΔVth in the case where the thickness of the metal oxide layer 130 is 1 to 4 nm is a good value of 2 V or less. In particular, ΔVth in the case where the thickness of the metal oxide layer 130 is 1 nm to 3 nm is smaller than Vth in the case where the metal oxide layer 130 is not arranged.

Figure 14:
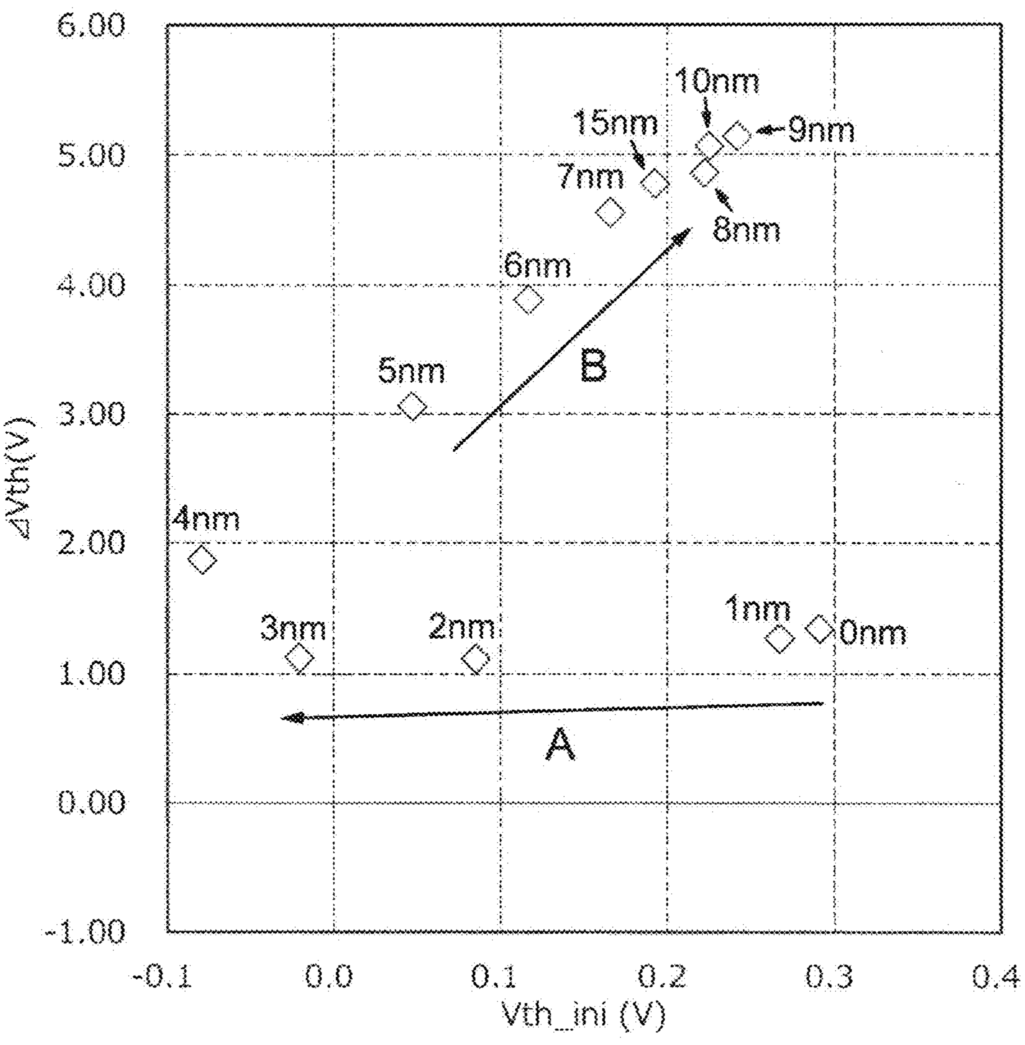
FIG. 14 is a diagram plotting correlations between electrical characteristics and reliability test results of a semiconductor device according to an embodiment of the present invention for each thickness.

FIG. 14 is a diagram plotting correlations between electrical characteristics and reliability test results of a semiconductor device according to an embodiment of the present invention for each thickness. In FIG. 14, the horizontal axis represents Vth_ini, and the vertical axis represents ΔVth. As shown in FIG. 14, the behavior along an arrow A is shown as the thickness of the metal oxide layer 130 increases, but the behavior along an arrow B is shown bounding on the case where the thickness of the metal oxide layer 130 is 4 nm. That is, in the case where the thickness of the metal oxide layer 130 is 5 nm or more, the tendency that the ΔVth by the PBTS reliability test increases is confirmed. In view of the above, it is preferable that the thickness of the metal oxide layer 130 is 4 nm or less.

As described above, the increase in ΔVth as the thickness of the metal oxide layer 130 increases is considered to be caused by the defect level present in the film of the metal oxide layer 130.

From the above, the thickness of the metal oxide layers 130 is preferably 1 nm or more and 4 nm or less, or 1 nm or more and 3 nm or less.

As described above, according to the semiconductor device 10 of the present embodiment, it is possible to realize the semiconductor device 10 having high mobility and good reliability test by setting the thickness of the metal oxide layers 130 to the above-described ranges.

2. Second Embodiment

A display device using a semiconductor device according to an embodiment of the present invention will be described with reference to FIG. 15 to FIG. 19. In the embodiment shown below, a configuration in which the semiconductor device 10 described in the first embodiment described above is applied to the circuit of the liquid crystal display device will be described.

[2-1. Outline of Display Device 20]

Figure 15:
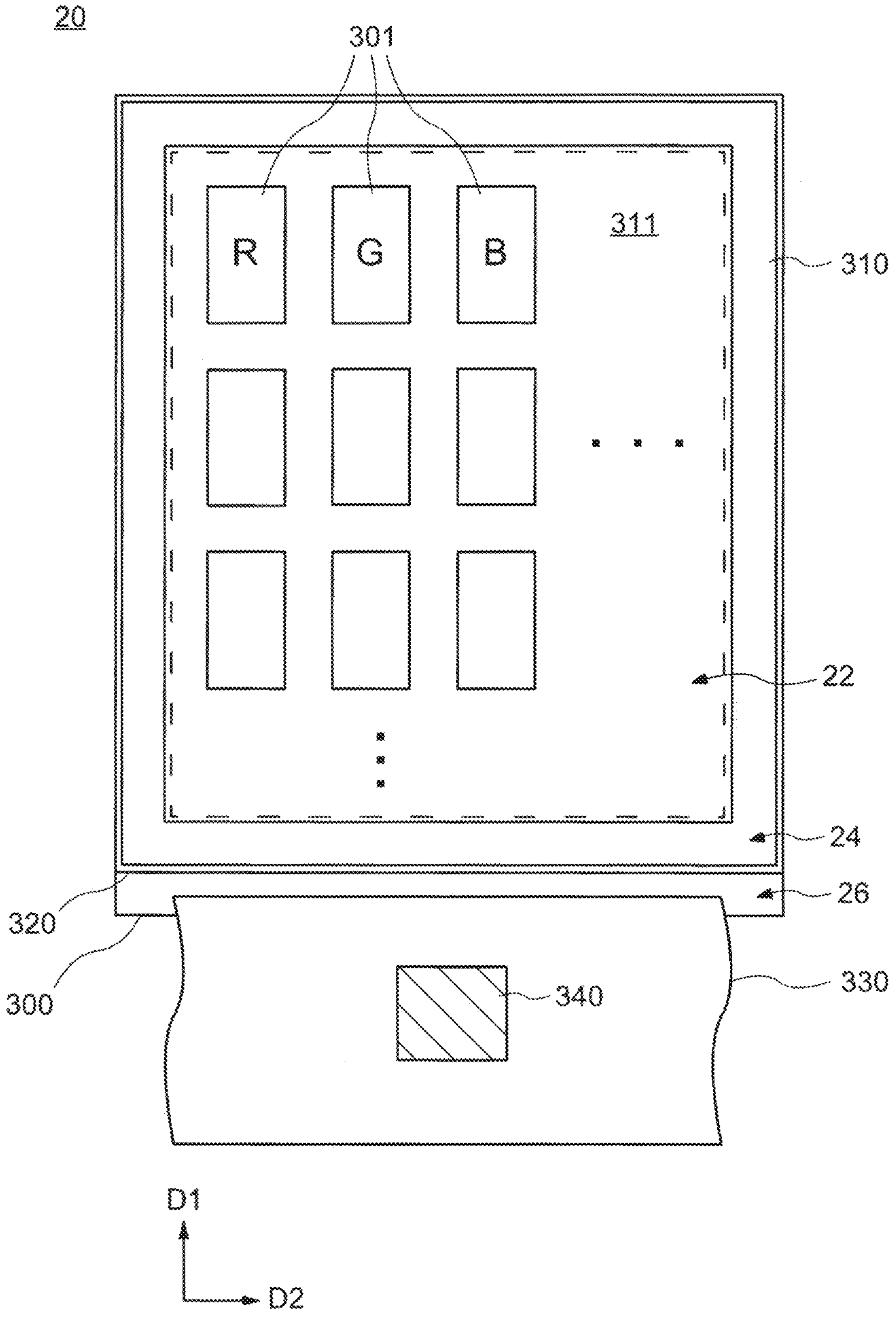
FIG. 15 is a plan view showing an outline of a display device according to an embodiment of the present invention.

FIG. 15 is a plan view showing an outline of a display device according to an embodiment of the present invention. As is shown in FIG. 15, the display device 20 includes an array substrate 300, a seal portion 310, a counter substrate 320, a flexible printed circuit substrate 330 (FPC 330), and an IC chip 340. The array substrate 300 and the counter substrate 320 are bonded together by the seal portion 310. A plurality of pixel circuits 301 is arranged in a matrix in a liquid crystal region 22 surrounded by the seal portion 310. The liquid crystal region 22 is a region overlapping a liquid crystal element 311, which will be described later, in a plan view.

A seal region 24 where the seal portion 310 is arranged is a region surrounding the liquid crystal region 22. The FPC 330 is arranged in a terminal region 26. The terminal region 26 is a region where the array substrate 300 is exposed from the counter substrate 320 and is arranged outside the seal region 24. Outside the seal region 24 means regions outside the region where the seal portion 310 is arranged and the region surrounded by the seal portion 310. The IC chip 340 is arranged on the FPC 330. The IC chip 340 supplies a signal for driving each pixel circuit 301.

[2-2. Circuit Configuration of Display Device 20]

Figure 16:
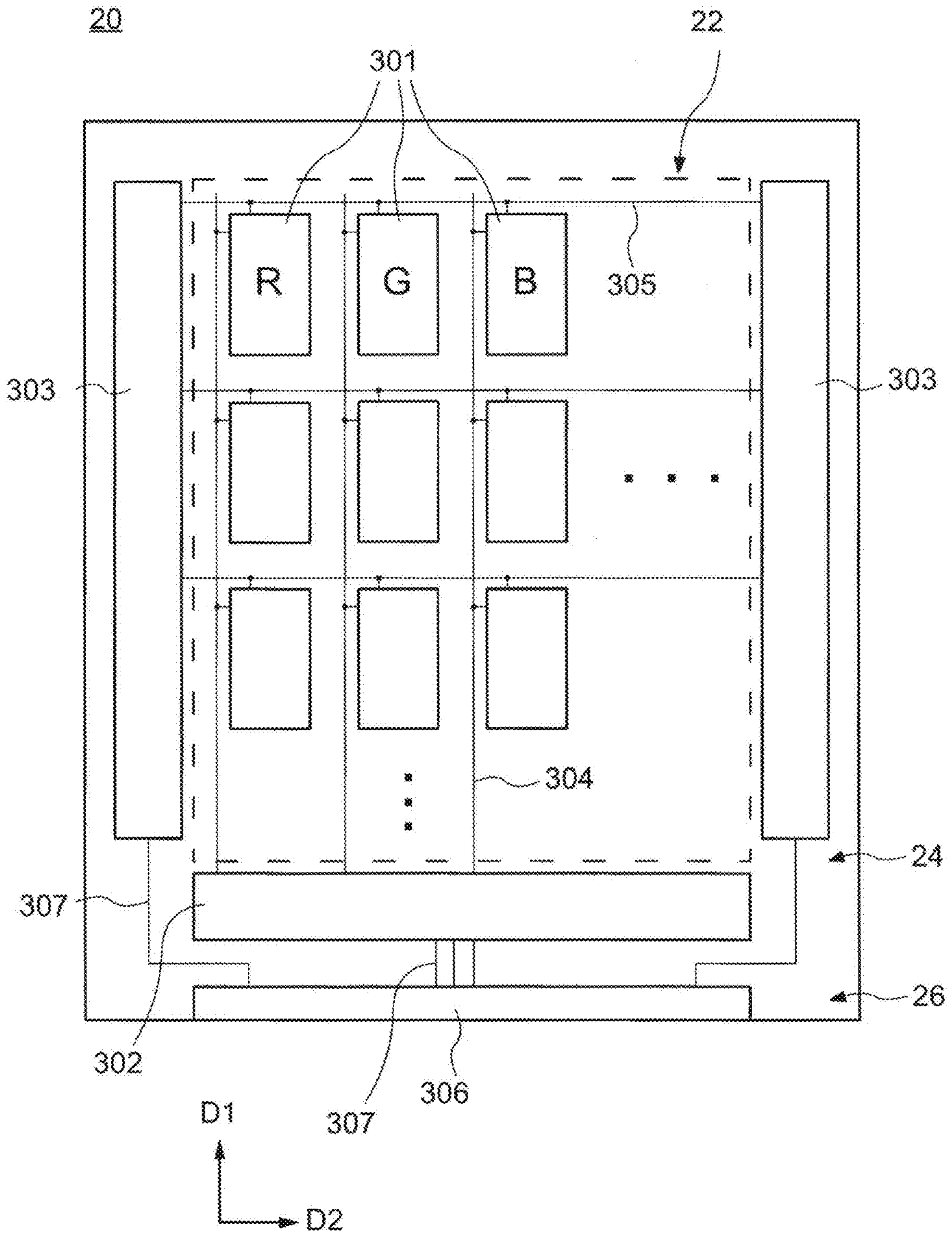
FIG. 16 is a block diagram showing a circuit configuration of a display device according to an embodiment of the present invention.

FIG. 16 is a block diagram showing a circuit configuration of a display device according to an embodiment of the present invention. As is shown in FIG. 16, a source driver circuit 302 is arranged at a position adjacent to the liquid crystal region 22 where the pixel circuit 301 is arranged in the direction D1 (column direction), and a gate driver circuit 303 is arranged at a position adjacent to the liquid crystal region 22 in the direction D2 (row direction). The source driver circuit 302 and the gate driver circuit 303 are arranged in the seal region 24 described above. However, the region where the source driver circuit 302 and the gate driver circuit 303 are arranged is not limited to the seal region 24. The source driver circuit 302 and the gate driver circuit 303 may be arranged in any region outside the region where the pixel circuit 301 is arranged.

A source wiring 304 extends from the source driver circuit 302 in the direction D1 and is connected to the plurality of pixel circuits 301 arranged in the direction D1. A gate wiring 305 extends from the gate driver circuit 303 in the direction D2 and is connected to the plurality of pixel circuits 301 arranged in the direction D2.

A terminal portion 306 is arranged in the terminal region 26. The terminal portion 306 and the source driver circuit 302 are connected by a connection wiring 307. Similarly, the terminal portion 306 and the gate driver circuit 303 are connected by the connection wiring 307. Since the FPC 330 is connected to the terminal portion 306, an external device which is connected to the FPC 330 and the display device 20 are connected, and each pixel circuit 301 arranged in the display device 20 is driven by a signal from the external device.

The semiconductor device 10 shown in the first embodiment is used as a transistor included in the pixel circuit 301, the source driver circuit 302, and the gate driver circuit 303.

[2-3. Pixel Circuit 301 of Display Device 20]

Figure 17:
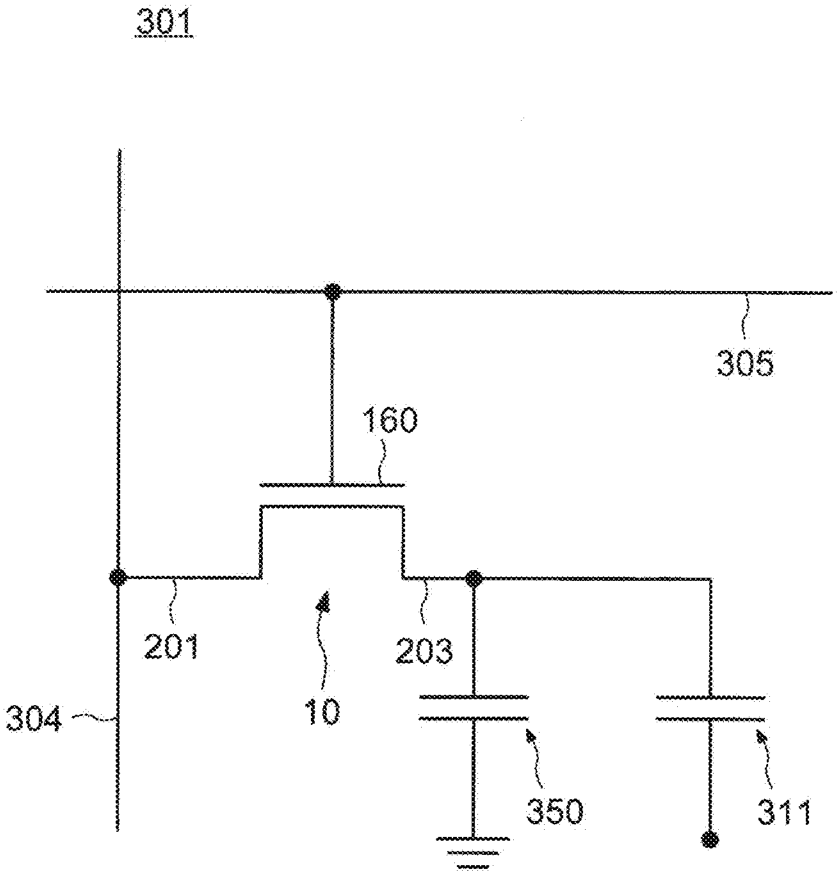
FIG. 17 is a circuit diagram showing a pixel circuit of a display device according to an embodiment of the present invention.

FIG. 17 is a circuit diagram showing a pixel circuit of a display device according to an embodiment of the present invention. As is shown in FIG. 17, the pixel circuit 301 includes elements such as the semiconductor device 10, a storage capacitor 350, and the liquid crystal element 311. The semiconductor device 10 has the gate electrode 160, the source electrode 201, and the drain electrode 203. The gate electrode 160 is connected to the gate wiring 305. The source electrode 201 is connected to the source wiring 304. The drain electrode 203 is connected to the storage capacitor 350 and the liquid crystal element 311. In the present embodiment, although an electrode indicated by 201 is referred to as a source electrode and an electrode indicated by 203 is referred to as a drain electrode for the convenience of explanation, the electrode indicated by 201 may function as a drain electrode and the electrode indicated by 203 may function as a source electrode.

[2-4. Cross-Sectional Structure of Display Device 20]

Figure 18:
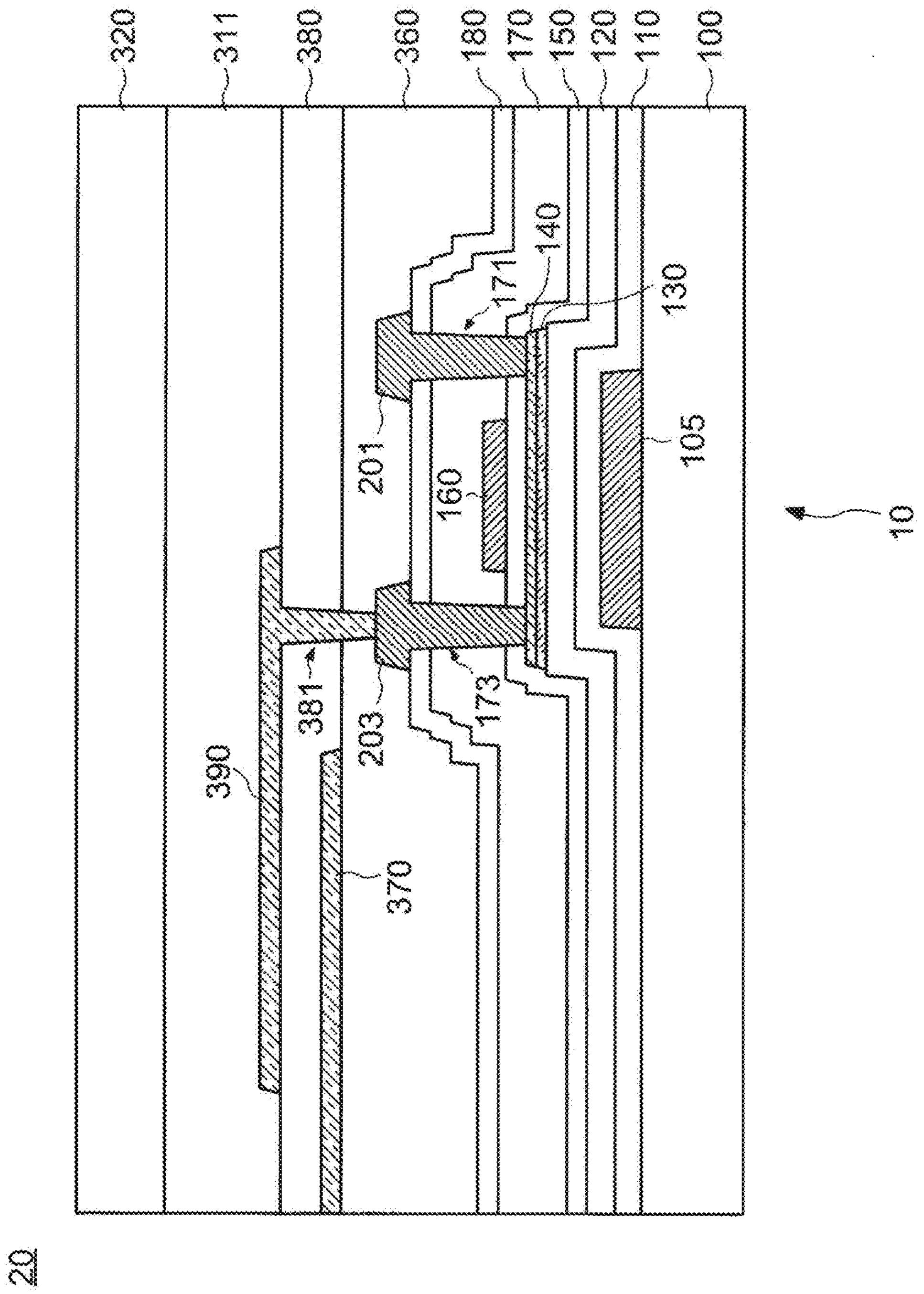
FIG. 18 is a cross-sectional view showing an outline of a display device according to an embodiment of the present invention.

FIG. 18 is a cross-sectional view of a display device according to an embodiment of the present invention. As shown in FIG. 18, the display device 20 is a display device in which the semiconductor device 10 is used. In the present embodiment, although a configuration in which the semiconductor device 10 is used for the pixel circuit 301 is exemplified, the semiconductor device 10 may be used for a peripheral circuit including the source driver circuit 302 and the gate driver circuit 303. In the following description, since the configuration of the semiconductor device 10 is the same as that of the semiconductor device 10 shown in FIG. 1, the description thereof will be omitted.

An insulating layer 360 is arranged on the source electrode 201 and the drain electrode 203. A common electrode 370 arranged in common for the plurality of pixels is arranged on the insulating layer 360. An insulating layer 380 is arranged on the common electrode 370. An opening 381 is arranged in the insulating layers 360 and 380. A pixel electrode 390 is arranged on the insulating layer 380 and within the opening 381. The pixel electrode 390 is connected to the drain electrode 203.

Figure 19:
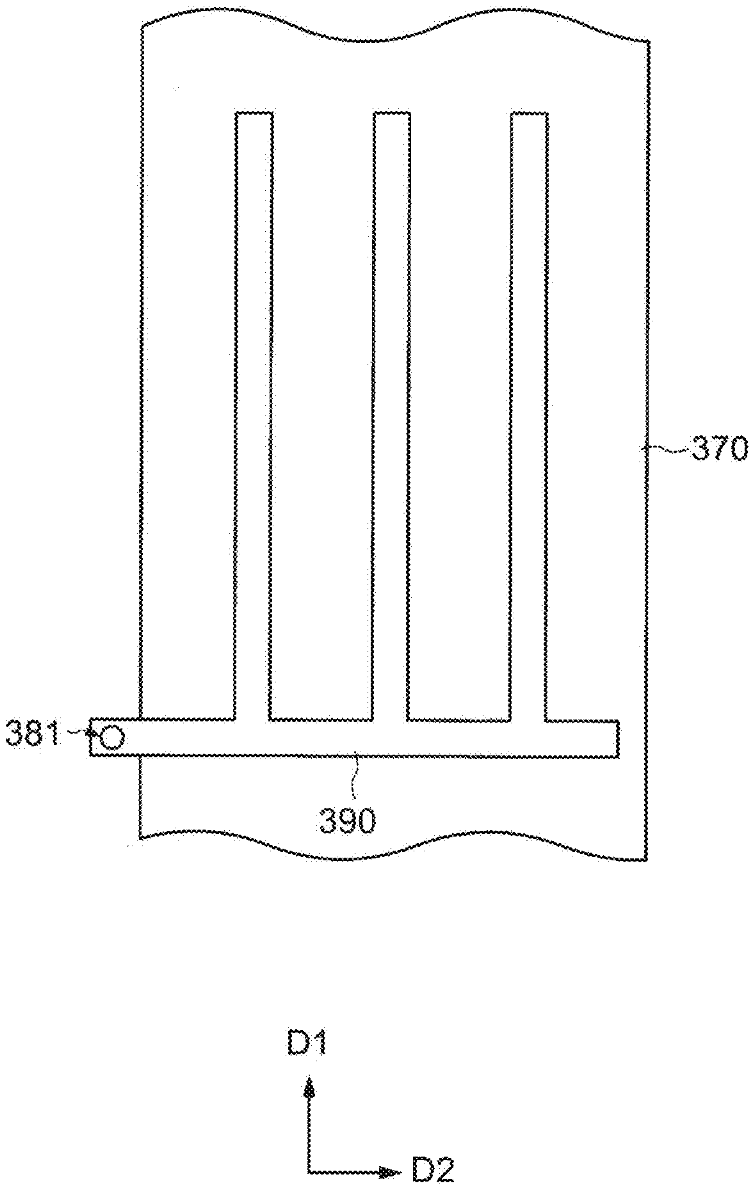
FIG. 19 is a plan view of a pixel electrode and a common electrode of a display device according to an embodiment of the present invention.

FIG. 19 is a plan view of a pixel electrode and a common electrode of a display device according to an embodiment of the present invention. As shown in FIG. 19, the common electrode 370 has an overlapping region overlapping the pixel electrode 390 in a plan view, and a non-overlapping region not overlapping the pixel electrode 390. When a voltage is supplied between the pixel electrode 390 and the common electrode 370, a horizontal electric field is formed from the pixel electrode 390 in the overlapping region toward the common electrode 370 in the non-overlapping region. The gradation of the pixel is determined by the operation of liquid crystal molecules included in the liquid crystal element 311 by the horizontal electric field.

3. Third Embodiment

A display device using a semiconductor device according to an embodiment of the present invention will be explained with reference to FIG. 20 and FIG. 21. In the present embodiment, a configuration in which the semiconductor device 10 explained in the first embodiment is applied to a circuit of an organic EL display device will be described. Since the outline and the circuit configuration of the display device 20 are the same as those shown in FIG. 15 and FIG. 16, the description thereof will be omitted.

[3-1. Pixel Circuit 301 of Display Device 20]

Figure 20:
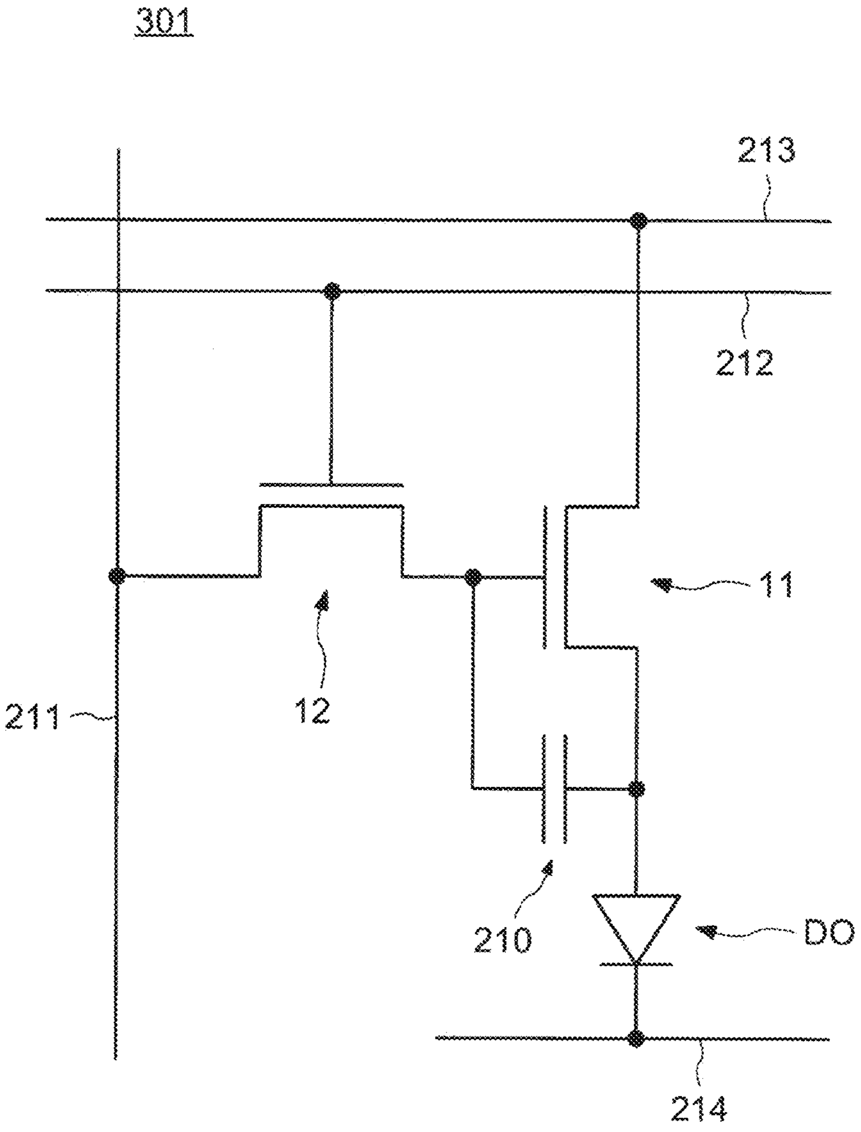
FIG. 20 is a circuit diagram showing a pixel circuit of a display device according to an embodiment of the present invention.

FIG. 20 is a circuit diagram showing a pixel circuit of a display device according to an embodiment of the present invention. As shown in FIG. 20, the pixel circuit 301 includes elements such as a drive transistor 11, a selection transistor 12, a storage capacitor 210, and a light-emitting element DO. The drive transistor 11 and the selection transistor 12 have the same configuration as the semiconductor device 10. The source electrode of the selection transistor 12 is connected to a signal line 211, and the gate electrode of the selection transistor 12 is connected to a gate line 212. The source electrode of the drive transistor 11 is connected to an anode power line 213, and the drain electrode of the drive transistor 11 is connected to one end of the light-emitting element DO. The gate electrode of the drive transistor 11 is connected to the drain electrode of the selection transistor 12. The other end of the light-emitting element DO is connected to a cathode power line 214. The storage capacitor 210 is connected to the gate electrode and the drain electrode of the drive transistor 11. A gradation signal for determining the light-emitting intensity of the light-emitting element DO is supplied to the signal line 211. A signal for selecting a pixel row in which the gradation signal described above is written is supplied to the gate line 212.

[3-2. Cross-Sectional Structure of Display Device 20]

Figure 21:
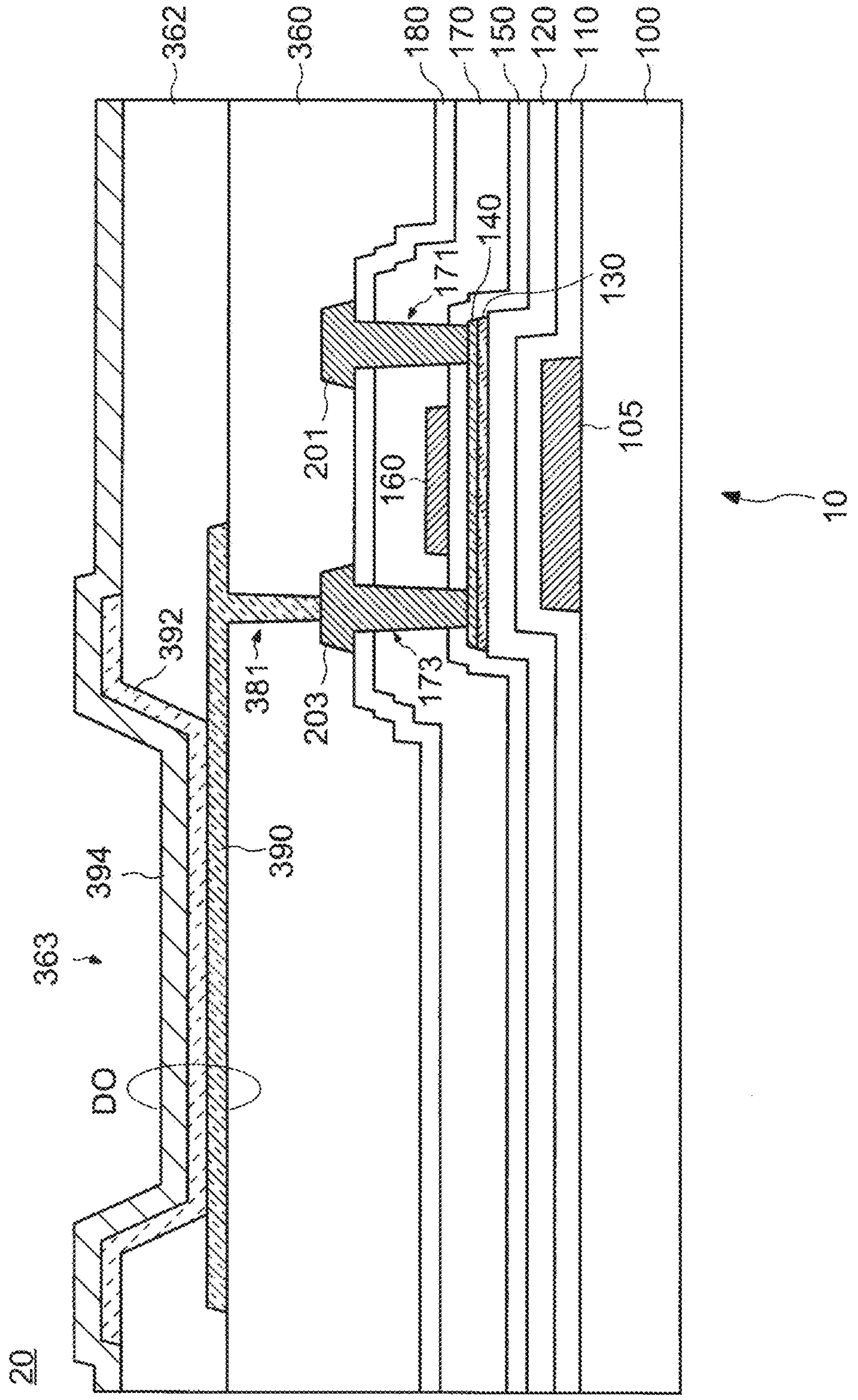
FIG. 21 is a cross-sectional view showing an outline of a display device according to an embodiment of the present invention.

FIG. 21 is a cross-sectional diagram of a display device according to an embodiment of the present invention. Although the configuration of the display device 20 shown in FIG. 21 is similar to the display device 20 shown in FIG. 18, the configuration above the insulating layer 360 of the display device 20 in FIG. 21 is different from the structure above the insulating layer 360 of the display device 20 in FIG. 18. Hereinafter, in the configuration of the display device 20 in FIG. 21, descriptions of the same configuration as the display device 20 in FIG. 18 are omitted, and differences between the two will be explained.

As shown in FIG. 21, the display device 20 has the pixel electrode 390, a light-emitting layer 392, and a common electrode 394 (the light-emitting element DO) above the insulating layer 360. The pixel electrode 390 is arranged above the insulating layer 360 and inside the opening 381. An insulating layer 362 is arranged above the pixel electrode 390. An opening 363 is arranged in the insulating layer 362. The opening 363 corresponds to a light-emitting region. That is, the insulating layer 362 defines a pixel. The light-emitting layer 392 and the common electrode 394 are arranged above the pixel electrode 390 exposed by the opening 363. The pixel electrode 390 and the light-emitting layer 392 are individually arranged for each pixel. On the other hand, the common electrode 394 is arranged in common for the plurality of pixels. Different materials are used for the light-emitting layer 392 depending on the display color of the pixel.

In the second embodiment and third embodiment, although the configuration in which the semiconductor device explained in the first embodiment was applied to a liquid crystal display device and an organic EL display device was exemplified, the semiconductor device may be applied to display devices (for example, a self-luminous display device or an electronic paper display device other than an organic EL display device) other than these display devices. In addition, the semiconductor device described above can be applied without any particular limitation from a small sized display device to a large sized display device.

Each of the embodiments described above as an embodiment of the present invention can be appropriately combined and implemented as long as no contradiction is caused. In addition, the addition, deletion, or design change of components, or the addition, deletion, or condition change of processes as appropriate by those skilled in the art based on a semiconductor device and a display device of each embodiment are also included in the scope of the present invention as long as they are provided with the gist of the present invention.

Further, it is understood that, even if the effect is different from those provided by each of the above-described embodiments, the effect obvious from the description in the specification or easily predicted by persons ordinarily skilled in the art is apparently derived from the present invention.

What is claimed is:

1. A semiconductor device comprising:
a substrate;
a metal oxide layer arranged above the substrate and having aluminum as a main component of the metal oxide layer;
an oxide semiconductor layer arranged above the metal oxide layer;
a gate electrode facing the oxide semiconductor layer; and
a gate insulating layer between the oxide semiconductor layer and the gate electrode,
wherein
a deposition rate of the metal oxide layer is equal to or less than 0.3 nm/sec, and
a thickness of the metal oxide layer is 1 nm or more and less than 3 nm.

2. The semiconductor device according to claim 1, wherein the oxide semiconductor layer is in contact with the metal oxide layer.

3. The semiconductor device according to claim 1, wherein
the oxide semiconductor layer is formed in an island shape, and
part of the metal oxide layer extends to outside the oxide semiconductor layer in a plan view.

4. The semiconductor device according to claim 1, wherein the metal oxide layer has a barrier property against oxygen and nitrogen.

5. The semiconductor device according to claim 1, further comprising a first insulating layer arranged between the substrate and the metal oxide layer, the first insulating layer including oxygen.

6. The semiconductor device according to claim 5, wherein the first insulating layer has a function capable of releasing oxygen by a heat treatment of 600° C. or less.

7. The semiconductor device according to claim 5, wherein the metal oxide layer is in contact with each of the first insulating layer and the oxide semiconductor layer between the first insulating layer and the oxide semiconductor layer.

8. The semiconductor device according to claim 1, wherein any semiconductor layers do not exist between the substrate and the metal oxide layer.

* * * * *